(12) United States Patent
Singer et al.

(10) Patent No.: US 6,964,485 B2
(45) Date of Patent: Nov. 15, 2005

(54) COLLECTOR FOR AN ILLUMINATION SYSTEM WITH A WAVELENGTH OF LESS THAN OR EQUAL TO 193 NM

(75) Inventors: Wolfgang Singer, Aalen (DE); Johannes Wangler, Königsbronn (DE)

(73) Assignee: Carl Zeiss SMT AG, Oberkochen (DE)

( * ) Notice: Subject to any disclaimer, the term of this patent is extended or adjusted under 35 U.S.C. 154(b) by 0 days.

(21) Appl. No.: 10/055,608

(22) Filed: Jan. 23, 2002

(65) Prior Publication Data

US 2003/0043455 A1 Mar. 6, 2003

(30) Foreign Application Priority Data

| Jan. 23, 2001 | (DE) | .......................................... 101 02 934 |
| Jun. 6, 2001 | (DE) | .......................................... 101 27 298 |
| Aug. 10, 2001 | (DE) | .......................................... 101 38 313 |

(51) Int. Cl.$^7$ .......................................... G02B 7/182
(52) U.S. Cl. ...................... 359/850; 359/357; 359/857; 359/864
(58) Field of Search ................................ 359/350, 351, 359/357, 448, 850, 857, 864; 378/34, 145, 146, 147; 362/551

(56) References Cited

U.S. PATENT DOCUMENTS

| 804,996 | A |   | 11/1905 | Anthony |
| 1,085,795 | A |   | 2/1914 | Boyle |
| 1,865,441 | A |   | 7/1932 | Mutscheller |
| 2,198,014 | A |   | 4/1940 | Ott ................. 88/24 |
| 3,148,834 | A |   | 9/1964 | Boehnke ................. 240/41.35 |
| 3,318,184 | A |   | 5/1967 | Jackson ......................... 88/24 |
| 3,501,626 | A |   | 3/1970 | Benard ....................... 240/1.1 |
| 3,689,760 | A |   | 9/1972 | Stewart, Jr. ................ 240/41.3 |
| 4,015,120 | A | * | 3/1977 | Cole ............................ 250/216 |
| 5,002,379 | A | * | 3/1991 | Murtha ....................... 359/853 |
| 5,369,511 | A | * | 11/1994 | Amos ........................... 359/15 |
| 5,745,547 | A |   | 4/1998 | Xiao ........................... 378/145 |
| 5,763,930 | A |   | 6/1998 | Partlo ..................... 250/504 R |
| 5,768,339 | A |   | 6/1998 | O'Hara ....................... 378/147 |
| 6,064,072 | A |   | 5/2000 | Partlo et al. ............ 250/504 R |
| 6,186,632 | B1 | * | 2/2001 | Chapman et al. ........... 359/857 |
| 6,198,793 | B1 |   | 3/2001 | Schultz et al. ................. 378/34 |
| 6,244,717 | B1 |   | 6/2001 | Dinger ....................... 359/859 |
| 6,285,737 | B1 | * | 9/2001 | Sweatt et al. ................. 378/85 |
| 6,389,101 | B1 | * | 5/2002 | Levine et al. ................. 378/85 |
| 6,469,827 | B1 | * | 10/2002 | Sweatt et al. ............... 359/351 |
| 6,624,878 | B1 | * | 9/2003 | Sandstrom et al. ........... 355/53 |

FOREIGN PATENT DOCUMENTS

| DE |     3001059 C2 | 4/1983 |
| DE |    19903807 A1 | 11/1999 |
| WO |   WO99/27542   | 6/1999 |
| WO |   WO99/57732   | 11/1999 |
| WO |   WO00/63922   | 10/2000 |
| WO |  WO01/08162 A1 | 2/2001 |
| WO |  WO01/09681 A2 | 2/2001 |
| WO |  WO01/09684 A1 | 2/2001 |

\* cited by examiner

*Primary Examiner*—Drew A. Dunn
*Assistant Examiner*—Joshua L. Pritchett
(74) *Attorney, Agent, or Firm*—Ohlandt, Greeley, Ruggiero & Perle

(57) ABSTRACT

There is provided a collector for guiding light with a wavelength of ≦193 nm onto a plane. The collector includes a first mirror shell for receiving a first ring aperture section of the light and irradiating a first planar ring section of the plane with a first irradiance, and a second mirror shell for receiving a second ring aperture section of the light and irradiating a second planar ring section of the plane with a second irradiance. The first and second mirror shells are rotationally symmetrical and concentrically arranged around a common axis of rotation, the first and second ring aperture sections do not overlap with one another, the first planar ring section substantially abuts the second planar ring section, and the first irradiance is approximately equal to the second irradiance.

47 Claims, 15 Drawing Sheets

Height in Plane 7 [mm]
in the Radial Direction

COLLECTOR FOR AN ILLUMINATION SYSTEM WITH A WAVELENGTH OF LESS THAN OR EQUAL TO 193 NM

CROSS REFERENCE TO RELATED APPLICATIONS

The present application is claiming priority of German Patent Application No. 101 02 934.9, filed on Jan. 23, 2001; German Patent Application No. 101 27 298.7, filed on Jun. 6, 2001; and German Patent Application No. 101 38 313.4, filed on Aug. 10, 2001.

BACKGROUND OF THE INVENTION

1. Field of the Invention

The invention concerns a collector for illumination systems with a wavelength of $\leq 193$ nm, preferably $\leq 126$ nm, and, particularly preferred, wavelengths in the extreme ultra-violet (EUV) range. A plurality of rotationally symmetrical mirror shells is arranged concentrically around a common axis of rotation. Light, regarded as being partitioned into a plurality of ring aperture sections, is received by the plurality of mirror shells, such that one of the ring aperture sections is assigned to each mirror shell. Each of the mirror shells, in turn, irradiates a planar ring section in a plane. Thus, there is an assignment or a correspondence between a ring aperture section, a mirror shell and a planar ring section. In addition, the invention also makes available an illumination system with such a collector, a projection exposure system with an illumination system according to the invention, as well as a method for the exposure of microstructures.

2. Description of the Prior Art

Nested collectors for wavelengths of $\leq 193$ nm, particularly wavelengths in the range of x-rays have been made known from a plurality of publications.

Thus, U.S. Pat. No. 5,768,339 shows a collimator for x-rays, wherein the collimator has several nested paraboloid-shaped reflectors. The collimator according to U.S. Pat. No. 5,768,339 serves for the purpose of forming an isotropically emitted beam bundle of an x-ray light source into a parallel beam.

A nested collector for x-rays has become known from U.S. Pat. No. 1,865,441, which serves for the purpose of collimating isotropic x-rays emitted by a source into a parallel beam bundle, as in the case of U.S. Pat. No. 5,768,339.

U.S. Pat. No. 5,763,930 shows a nested collector for a pinch-plasma light source, which serves for the purpose of collecting the radiation emitted by the light source and bundling it in a light guide.

U.S. Pat. No. 5,745,547 shows several arrangements of multichannel optics, which serve for the purpose of bundling into one point the radiation, particularly x-ray radiation, due to multiple reflections coming from a source.

In order to achieve a particularly high transmission efficiency, the invention according to U.S. Pat. No. 5,745,547 proposes elliptically shaped reflectors.

An arrangement has become known from DE 30 01 059 C2 for use in x-ray lithography systems, and this arrangement has nested parabolic mirrors arranged between the x-ray source and the mask. These mirrors are arranged in such a way that the divergent x-ray radiation will be formed into a parallel-running output beam bundle.

The arrangement according to DE 30 01 059 in turn serves only for the purpose of obtaining a good collimation for x-ray lithography.

The arrangement of nested reflectors, which has become known from WO 99/27542, in an x-ray proximity lithography system serves for the purpose of refocusing the light of a light source, so that a virtual light source is formed. The nested reflectors may have an ellipsoid form.

A nested reflector for high-energy photon sources has become known from U.S. Pat. No. 6,064,072, which serves for the purpose of shaping the divergent x-ray radiation into a parallel beam bundle.

WO 00/63922 shows a nested collector, which serves for the purpose of collimating the neutron beam.

A nested collector for x-ray radiation has become known from WO 01/08162, which is characterized by a surface roughness of the inner reflecting surface, of the individual mirror shells, of less than 12 Å rms. The collectors shown in WO 01/08162 also comprise systems with multiple reflections, particularly also Wolter systems, and are characterized by a high resolution, as is required, for example, for x-ray lithography.

For illumination optics to be used in EUV lithography, such as, for example, shown in DE 199 03 807 or WO 99/57732, in addition to resolution, high requirements are also placed on regularity or uniformity and telecentry. In such systems, the light of the light source is collected by a collector for specific light sources.

SUMMARY OF THE INVENTION

The object of the present invention is to provide a collector for an illumination system for microlithography with wavelengths of $\leq 193$ nm, preferably $<126$ nm, and particularly preferred, for wavelengths in the EUV range, which complies with the high requirements for uniformity and telecentry that are required for illumination optics. Especially in EUV-lithography, the illumination should be as homogeneous as possible.

According to the invention, this object is solved by a collector with an object-side aperture that receives light emitted from a light source and comprises a plurality of rotationally symmetrical mirror shells that are arranged concentrically around a common axis of rotation giving a so-called nested collector. An area to be illuminated lies in a plane. The area is partitioned into a plurality of planar ring sections, also denoted as ring elements. Ring aperture sections of the light, also denoted as ring aperture elements, do not overlap and they may have spatial gaps therebetween, whereas the planar ring sections substantially abut one another. That is, given two adjacent planar ring sections, one being an inner section and the other an outer section, the outer perimeter of inner planar ring section substantially abuts the inner perimeter of outer planar ring section.

For example, consider a case of two such mirror shells. A first of the mirror shells receives a first ring aperture section of the light and irradiates a first of the planar ring sections, and a second of the mirror shells receives a second ring aperture section of the light and irradiates a second of the planar ring sections. The dimensions of the mirror shells in the direction of the axis of rotation as well as the surface parameters and the positions of the mirror shells are selected so that the irradiances of the individual planar ring sections are approximately equal to one another.

The inventors have recognized that a uniform illumination to a great extent can be achieved in a pregiven area of a plane by configuring a nested collector according to the invention. It is particularly preferred that the mirror shells are an aspheric annular segment, especially an ellipsoid, a paraboloid or a hyperboloid. A completely parallel beam bundle and thus a light source lying in infinity results for a paraboloid. For example, if one wishes to produce secondary light sources by means of a first optical element with first raster elements, which is arranged in the plane to be illuminated according to U.S. Pat. No. 6,198,793 B1, the disclosure content of which is fully incorporated into the present application, then in the case of mirror shells, which are shaped as ring-shaped segments of a paraboloid, the individual raster elements must have a collecting or convergent effect.

The convergent effect may also be transferred to the collector. Such a collector according to the invention would comprise shells, which are segments cut out from ellipsoids, so that a convergent beam bundle is formed. By transferring the convergent effect to a collector, which comprises shells that are segments cut out from ellipsoids, the first raster elements of the first optical element can be formed, for example, as planar facets.

Collectors with shells, which are segments cut out from hyperboloids, lead to a divergent beam bundle and are then particularly of interest, if the collector is to be dimensioned as small as possible.

In contrast to the nested collectors according to the prior art, the collector according to the invention is characterized in that the dimensions of the reflectors of the different shells are different in the direction of the axis of rotation. Thus, an extensively homogeneous illumination can be produced in an annular region in the plane to be illuminated. If the dimensions and distances of the reflectors are substantially the same as in the prior art cited in the introductory part of this document, then, for example, a collimated beam or a focused beam can be achieved, while a homogeneous illumination in an annular region, in contrast, cannot be provided. In addition, the reflection losses that are dependent on angle of incidence can be compensated for by a suitable design of the collector, so that a homogeneous illumination is provided in a pregiven plane.

In a preferred embodiment of the collector according to the invention, the position of an outer mirror shell has a longer distance to the plane to be illuminated than the position of an inner mirror shell. In this application the mean value of the initial point and the end point of a shell referred to the axis of rotation of the collector is understood as the position of a mirror shell. Inner mirror shells are understood in this application as those mirror shells that have the shorter distance to the axis of rotation with regard to two mirror shells, an inner mirror shell and an outer mirror shell. Since homogenization is also achieved with the nested collectors only in a discrete approximation, it is of advantage if the collector comprises as many shells as possible. Preferably, the collector according to the invention has more than four, particularly preferred, more than seven, and most particularly preferred, more than ten reflectors in a nested arrangement.

In case of an isotropically emitting light source, the collector according to the invention assures that the same angular segments are imaged on the same surfaces. In addition, the reflection losses that are dependent on angle of incidence can be compensated for by a suitable design of the collector, so that a homogeneous illumination is provided in the plane to be illuminated.

In a case of a non-isotropic source, the irradiation characteristic can be converted by the collector into a homogeneous illumination.

In a preferred embodiment, the radial dimensions of at least two planar ring sections are of equal size, while the dimension in the direction of the axis of rotation of the mirror shell of the collector that is assigned to the inner planar ring section is larger than the dimension in the direction of the axis of rotation of the mirror shell of the collector assigned to the outer planar ring section. The inner planar ring section is understood as the planar ring section that has the shorter distance to the axis of rotation of two planar ring sections, an inner and an outer planar ring section.

Advantageously, the collector according to the invention is configured such that the quotient of a first ratio of the radial dimension of a first planar ring section to the angular extent of the assigned ring aperture section and a second ratio of the radial dimension of a second planar ring section to the angular extent of the assigned ring aperture section is of the same magnitude as the quotient of a first radiant intensity, which flows into the first ring aperture section, and of a second radiant intensity, which flows into the second ring aperture section, i.e., the following equation applies:

$$\frac{dA_1}{d\Omega_1} \div \frac{dA_2}{d\Omega_2} = I(\alpha_1) \div I(\alpha_2)$$

In an alternative embodiment of the invention, provision is made to form the nested mirror shells in such a way that multiple reflections occur at one mirror shell.

The reflection angles can be kept small by multiple reflections at one shell.

The reflectivity behaves nearly linearly with the angle of incidence relative to the surface tangent in the case of reflection under grazing incidence with small angles of incidence of less than 20° relative to the surface tangent in materials such as molybdenum, niobium, ruthenium, rhodium, palladium or gold. This means that the reflection losses for a reflection, for example, at 16° or for two reflections at 8° are approximately the same. For the maximally achievable aperture of the collector, however, it is advantageous to use more than one reflection.

Particularly preferred are systems with two reflections. Collectors with two reflections can be formed, for example, as nested Wolter systems with first mirror shells, which are annular segments cut out from hyperboloids, and second mirror shells, which are annular segments cut out from ellipsoids.

Wolter systems are known from the literature, for example, from Wolter, Annalen der Physik 10, 94–114, 1952. In the case of Wolter systems with a real intermediate image of the source, which is formed by the combination of a hyperboloid surface with an ellipsoid surface, reference is made to J. Optics, vol. 15, 270–280, 1984.

A particular advantage of Wolter systems is that a maximum collection aperture of up to $NA_{max}$ of approximately 0.985 corresponding to an aperture angle of 80° can be selected in the case of a Wolter system with two reflections with incidence angles smaller than 20° relative to the surface tangent. In such a case one is still in the high-reflecting region of the reflection under grazing incidence with a reflectivity>70%.

In a first embodiment of the invention, the first ring-shaped segment and the second ring-shaped segment of a shell are not continuously fit together, but an unused region of the mirror shell, a so-called gap, lies between the first and the second ring-shaped segments.

In addition to the collector, the invention also makes available an illumination system with such a collector. The illumination system is preferably a double faceted illumination system with a first optical element with first raster elements and a second optical element with second raster elements, as shown in U.S. Pat. No. 6,198,793 B1, the disclosure content of which is fully incorporated by reference into the present document.

The first and/or second raster elements can be planar facets or facets with convergent or divergent effect.

In one embodiment of the invention, only a ring-shaped area is illuminated on the first optical element with first raster elements. The first raster elements are then preferably arranged inside the ring-shaped area.

The illumination system comprising the collector according to the invention preferably is used in a projection exposure system for microlithography, wherein such a projection exposure system is shown for example in PCT/EP 00/07258, the disclosure content of which is fully incorporated in the present application. Projection exposure systems comprise a projection objective arranged in the light path after the illumination device, for example, a 4-mirror projection objective as shown in U.S. Pat. No. 6,244,717 B1, the disclosure content of which is fully incorporated in the present application.

BRIEF DESCRIPTION OF THE DRAWINGS

The invention will be described by example on the basis of the drawings, without any restriction. Here.

DESCRIPTION OF THE INVENTION

In the present document, the terms of radiometry, which are listed in the following Table 1, are used according to Naumann/Schröder, "Bauelemente der Optik" (Components of Optics), Hauser Publishers 1992, pp. 28–28.

TABLE 1

Terms of radiometry

| Physical quantity | Formula | Unit |
| --- | --- | --- |
| Radiant Flux $\Phi_e$ (Radiant Flux) | $\Phi_e = \dfrac{\partial Q}{\partial t}$ | Watt [W] |
| Irradiance $E_e$ (Irradiance or flux density) | $E_e = \dfrac{d\Phi_e}{dA_0}$ | Watts/cm$^2$ |
| Radiant Intensity $I_e$ (Radiant Intensity) | $I_e = \dfrac{d\Phi_e}{d\Omega}$ | Watts/cm$^2$/steradians |
| Radiance $L_e$ (Radiance) | $L_e = \dfrac{d\Phi_e}{dA_s \cos\alpha \cdot d\Omega}$ | Watts/cm$^2$/steradians |

Figure 1:
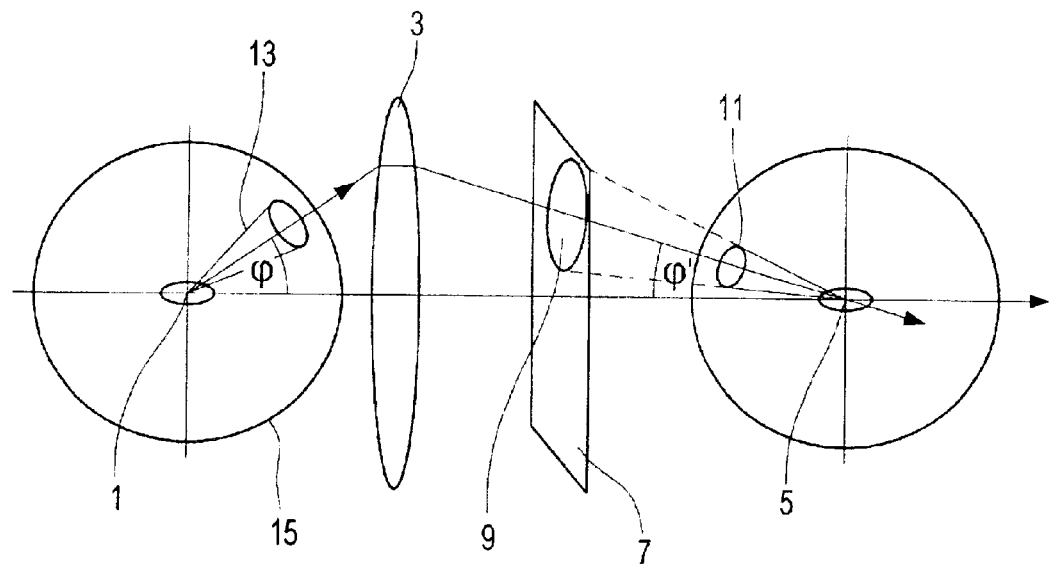
FIG. 1 shows a schematic diagram of a collector.

A schematic diagram of a system with light source 1, collector 3, source image 5 and intermediate plane 7 is shown in FIG. 1. Light source 1 irradiates at a specified radiant intensity. The latter generally depends on angles $\phi$ and $\varphi$ (angles around the z-axis, not depicted): $1(\phi, \varphi)$. In FIG. 1, only $\phi$ is depicted, because of the following equation for axially symmetrical light sources.

The following applies to axially symmetrical light sources:

$$1(\phi, \varphi) = 1(\phi).$$

The collector 3 collects the irradiated light and bundles it. The collector 3 forms an image of light source 1, whereby light source image 5 can either be real, as shown in FIG. 1, or virtual. Also, light source 1 may itself involve an image of a physical light source. In plane 7 behind collector 3, in both cases, a specific illumination 9 is obtained, which corresponds to the projection of the radiant intensity of the radiation cone 11, which is the solid angle element at angle $\phi'$ in the image space of the collector. If the illumination is homogenized in plane 7, then it is also automatically homogenized in any other plane behind the collector, as long as it lies sufficiently far away from the image plane, in which the image 5 of light source 1 lies. A radiation cone 13 that belongs to the object space corresponds to a radiation cone 11 in the image space and is filled with radiant intensity $1(\phi)$ irradiated into the solid angle element at angle $\phi$.

According to the invention, any light source 1 is imaged into an image of the source. The source image can be real (i.e., in the direction of light to the right of collector 3) or virtual (i.e., in the direction of light to the left of collector 3) or can lie in infinity.

In addition, the irradiation characteristic of any light source 1 is transformed by the invention so that an extensively homogeneous illumination is produced in a plane in front of or behind the intermediate image.

According to the invention, the following should apply:

$$E = \frac{\Phi}{dA} = \frac{R(\alpha)I*(\alpha)d\Omega}{dA} = const. \quad (2.1)$$

E: irradiance in plane 7
$\Phi$: radiant flux
dA: surface element in plane 7
$d\Omega$: angular element in the object-side aperture
$I*(\alpha)$: Radiant intensity of the source at angle $\alpha$
$R(\alpha)$: attenuation or screening factor proportional to the light losses due to the finite angle-dependent reflectivity of the collector (in the following $I(\alpha)=R(\alpha)\cdot I*(\alpha)$ is also used).

The following thus must apply to two planar ring sections with the same irradiance:

$$E = \frac{\Phi_1}{dA_1} = \frac{I(\alpha_1)d\Omega_1}{dA_1} = \frac{\Phi_2}{dA_2} = \frac{I(\alpha_2)d\Omega_2}{dA_2} \quad (2.2)$$

from which follows the relation:

$$\frac{d\Omega_2}{dA_2} \div \frac{d\Omega_1}{dA_1} = I(\alpha_1) \div I(\alpha_2) \quad (2.3)$$

In the case of anisotropic sources or large differences in the reflection losses $R(\alpha)$, ring aperture sections and/or planar ring sections in plane 7 must be selected according to Eq. (2.3).

In general, the task of producing an intermediate image and at the same time fitting an irradiation characteristic cannot be fulfilled with simple optical elements, such as, e.g., a mirror or a lens. In the case of rotationally symmetrical irradiation characteristics around the z-axis, which is presently identical to the optical axis of the system, an equal illumination can be achieved by means of a special type of Fresnel optics, at least for discrete regions.

This is explained below in the example of a real intermediate image of source 1. Similar constructions result, and would be apparent to a person of average skill in the art, for virtual intermediate images or a source image in infinity.

Figure 2:
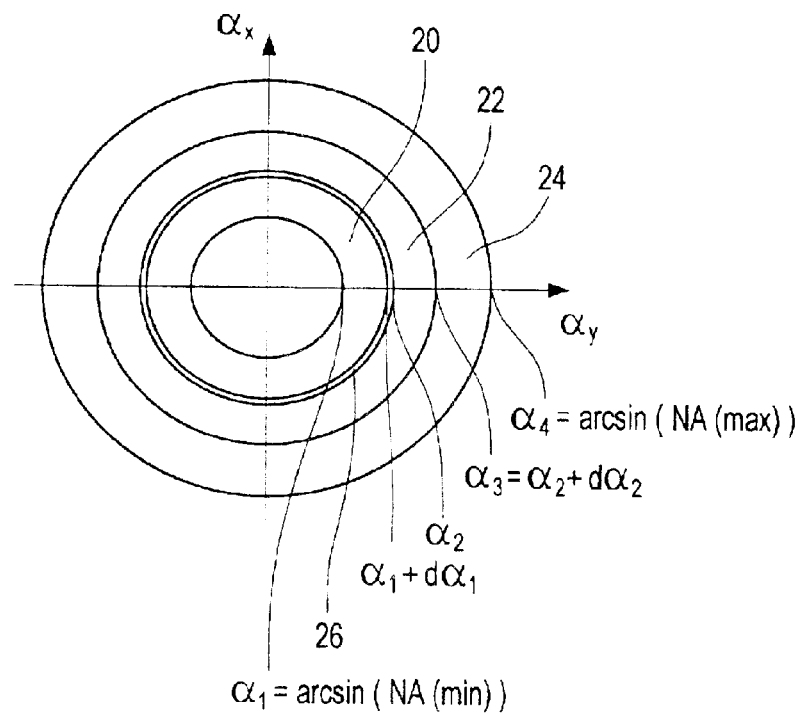
FIG. 2 shows a diagram of a ring aperture section around a light source.

For example, three angular segments or ring aperture sections 20, 22, 24, as shown in FIG. 2, are selected around light source 1, and these are arranged in such a way that an equivalent power is irradiated in the respective angular segments or ring aperture sections in the radial direction from light source 1. In the case of an isotropically irradiating light source 1, such as, for example, a dense plasma focus source, then identical angular increments $d\alpha$ are selected, while in the case of anisotropically irradiating sources, the angular distance is adapted correspondingly, so that the following applies:

$$\Phi = \int_{\alpha_i}^{\alpha_{i+1}} I(\alpha)d\alpha = \Phi_i = const. \quad (2.4)$$

wherein
$\Phi_i$: radiant flux $I(\alpha)$: radiant intensity of the source at angle $\alpha$
$\alpha_i$: inner angle of the $i^{th}$ angular segment
$\alpha_{i+1}$: external angle of the $i^{th}$ segment with $\alpha_{i+1}=\alpha_i+d\alpha_i$
$d\alpha_i$: width of the $i^{th}$ angular segment The generally different angular increments $d\alpha_i$ are determined by means of Equation (2.4).

FIG. 2 shows a cross-section of an aperture having three ring aperture sections 20, 22, 24, where a light source is a point source. There is a central shading. Ring aperture sections 20, 22, 24 lie between $NA_{min}$ and $NA_{max}$. Ring aperture sections 22 and 24 are continuously fit together; there is no gap or discontinuity between ring aperture sections 22 and 24. That is, the outer perimeter of ring aperture section 22 abuts the inner perimeter of ring aperture section 24. However, there is a small gap or discontinuity between the outer perimeter of ring aperture section 20 and the inner perimeter of ring aperture section 22. Note that this configuration of the ring aperture sections is merely exemplary.

Figure 3:
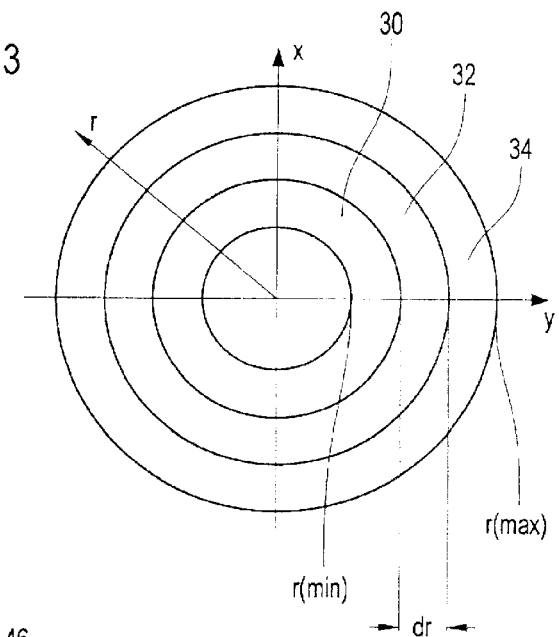
FIG. 3 shows a diagram of planar ring sections in a plane to be illuminated.

Referring to FIG. 3, planar ring sections 30, 32, 34 are assigned to the individual ring aperture segments or ring aperture sections 20, 22, 24. The planar ring sections 30, 32, 34 are selected so that distances dr of the same magnitude are achieved between the edge or rim rays of the planar ring sections 30, 32, 34. The radial dimensions of at least two planar ring sections, e.g., planar ring sections 30 and 32, are of equal size, i.e., dr. Thus, the following applies:

$$r_i = r_1 + i \cdot dr \quad (2.5)$$

wherein
$r_i$: distance of the $i^{th}$ planar ring section in plane 7 to be illuminated from the axis of rotation RA
dr: height increment=radial dimension
$r_1$: any starting height (evident center-to-center shadowing in the case of the nested collector).

FIG. 3 shows the illumination in plane 7 with planar ring sections 30, 32, 34. In plane 7, there is no discontinuity between planar ring sections 30, 32 and 34. For example, the outer perimeter of planar ring section 32 coincides with the inner perimeter of planar ring section 34.

The respective elliptic shells of collector 3 are then determined by means of the points of intersection of selected rays. In the case of a virtual intermediate image, these shells are shaped like a hyperbola, and in the case of a source image in infinity these shells are parabola-shaped. To determine the respective shells a representative ray is selected for each ring aperture section 20, 22, 24.

For an ellipsoid-shaped or hyperbola-shaped or parabola-shaped shell, the indication of object point and image point, here source 1 and source image 5, and only one other point are thus sufficient to determine the shells. However, presently two points are present, namely an initial point and an end point of the collector shell, i.e., the problem is overdefined. However, since the imaging quality for the source can usually almost be disregarded for illumination purposes, one can add, for example, a conical component in the form of a wedge or a section of a cone to the ellipses or hyperbolas or parabolas, which corresponds to a slight defocusing, which does not matter. Alternatively, one can accept a slight shadowing, since the gaps that occur can be selected to be very small. The size of the gaps can be minimized by means of the layout and particularly the number of shells. The gaps are selected, for example, so that they occur in front of the collector, i.e., in the power taken up from the source, and not behind the collector, in the surface to be illuminated.

It is also possible to construct the collector only from sections of cones, particularly if the collector comprises many shells. This is advantageous in terms of manufacture.

Disregarding the reflection losses and shadowing, it is then assured that the radiant flux Φ is almost the same in the angular segments or ring aperture sections 20 to 24 as well as in surface segments or planar ring sections 30 to 34.

In principle, however, it is also possible to compensate for losses of reflection that are dependent on angle and thus on segment by suitable correction in the angular increments $\alpha_i$, whereby, since one would like to illuminate plane 7 in an extensively homogeneous manner according to the invention, the ring aperture sections, which are assigned to planar ring sections with the same increments, are not of the same size.

Figure 4:
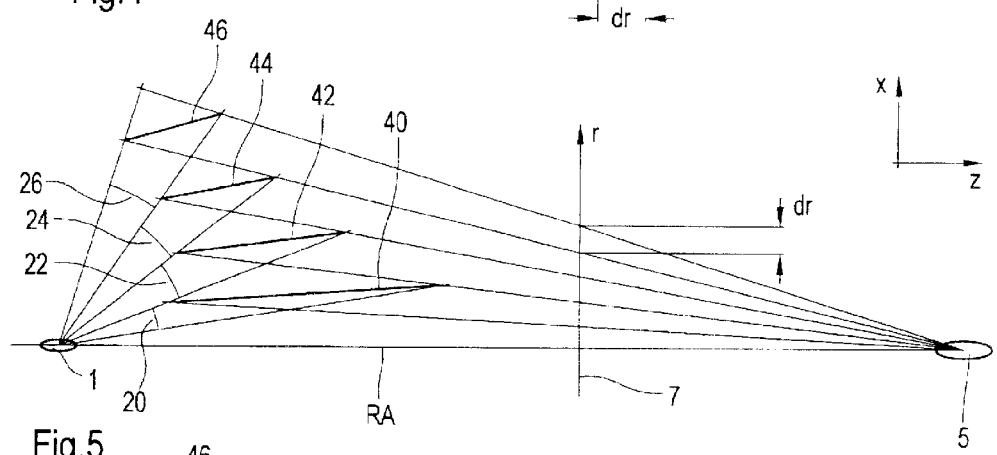
FIG. 4 shows a nested collector comprising ellipsoid segments.

FIG. 4 shows a nested collector 3, comprising ellipsoid segments, which are arranged in rotationally symmetrical manner around the z-axis, which assures an extensively equally distributed illumination of plane 7. Only one half of collector 3 is represented in section, based on the rotational symmetry around the z-axis.

According to FIG. 4, a family or set of shells 40, 42, 44, 46 results, which are arranged so that the distances between adjacent shells is approximately equal. The distances are taken with respect to the maximum shell diameter, which is approximately proportional to the number of shells i. As is apparent from FIG. 4, the dimensions of mirror shells 40, 42, 44 and 46 in the direction of the z-axis, i.e., the lengths of the mirror shells, are different from one another. More specifically, for example, mirror shell 46 is shorter than mirror shell 40. FIG. 4 also shows light source 1, plane 7 to be illuminated as well as source image 5. Three ring aperture sections 20, 22, 24 correspond to those in the previous figures, and in FIG. 4 a fourth ring aperture section 26 is also shown.

Figure 5:
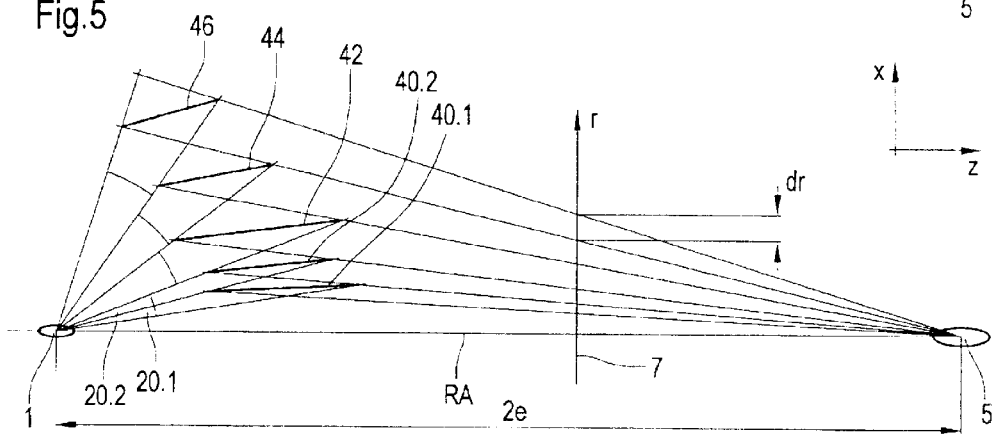
FIG. 5 shows a nested collector comprising ellipsoid segments with a different number of shells than in FIG. 4.

Alternatively, an arrangement is possible, in which the length of the shells is reduced, as shown in FIG. 5. For example, the innermost angular segment or ring aperture section 20 can be divided into two angular segments or ring aperture sections 20.1 and 20.2. Correspondingly, in plane 7, the assigned innermost planar ring section (not shown in FIG. 5) is also correspondingly divided into two planar ring sections (not shown in FIG. 5). Then two shells 40.1, 40.2 result for the two innermost segments, which are shorter than one shell 40, as can be clearly seen from FIG. 5. The same components as in the preceding figures are given the same reference numbers.

Figure 6:
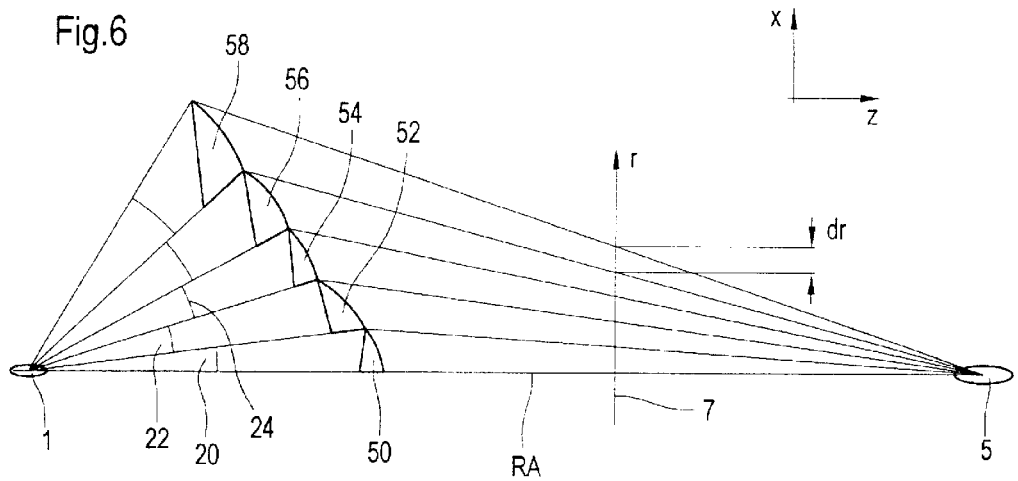
FIG. 6 shows a refractive nested collector.

A similar arrangement can also be presented for refractive systems. In refractive systems, the nested mirror shells 40, 42, 44, 46 are replaced by ring-shaped off-axis segments of lenses 50, 52, 54, 56, as shown in FIG. 6. FIG. 6 also shows a fifth lens 58 for a fifth ring aperture section.

FIG. 6 shows schematically an arrangement of ring-shaped off-axis segments of lenses 50, 52, 54, 56 and 58, which produces an equally distributed illumination in plane 7 for a specific irradiation characteristic of source 1. Only one-half of the system, which is rotationally symmetrical around the z-axis, is shown schematically in section. Angular elements of different sizes are deflected on height segments of equal sizes and thus a homogeneous illumination is also achieved in the case of an anisotropic source irradiation.

Nested, reflective collectors necessarily have a central shadowing, i.e., below a specific aperture angle $NA_{min}$ the radiation of the source cannot be collected. This radiation must thus be blocked with a diaphragm, so that it does not reach the illumination system behind the collector. The diaphragm can be introduced, e.g., in the region of the collector.

The invention will be described below in more detail on the basis of a further embodiment.

The starting point is a point-to-point imaging with real source image in the case of an isotropic source with a family or set of ellipses corresponding to the invention, whereby the shell diameters are selected that the distance between adjacent shells is approximately equal.

An ellipse is defined according to the equation:

$$\frac{z^2}{a^2} + \frac{x^2}{b^2} = 1 \tag{3.1}$$

wherein $$e = \sqrt{a^2 b^2} \tag{3.2}$$

Figure 7:
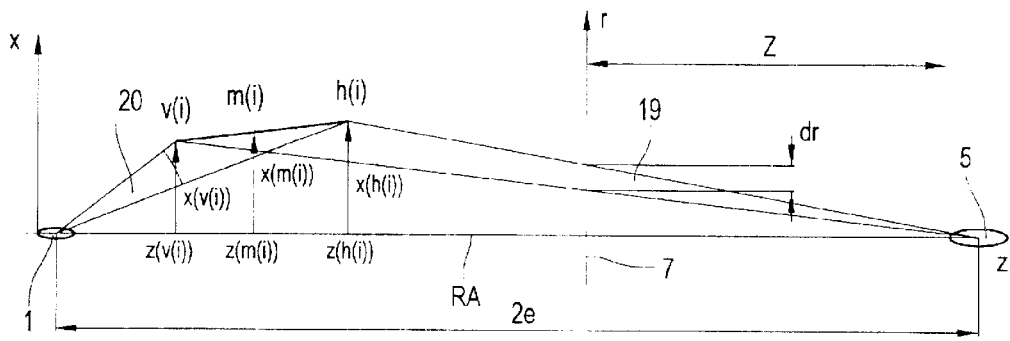
FIG. 7 shows the $i^{th}$ ellipse segment of a nested collector.

FIG. 7 shows as an example the $i^{th}$ ellipse segment. Since the latter is rotationally symmetrical around the z-axis, only one-half is shown in section. Quantities used for a mirror shell for the calculation according to Table 1 are shown in FIG. 7. The same reference numbers are used for the same segments as in the preceding figures. The denotation is as follows:

v(i) the $i^{th}$ initial point of the $i^{th}$ mirror shell;
x(v(i)) the x-coordinate of the $i^{th}$ initial point;
z(v(i)) the z-coordinate of the $i^{th}$ initial point, i.e., the initial point with respect to the axis of rotation RA;
h(i) the $i^{th}$ end point of the $i^{th}$ mirror shell;
x(h(i)) the x-coordinate of the $i^{th}$ end point;
z(h(i)) the z-coordinate of the $i^{th}$ end point, i.e., the end point with reference to the axis of rotation RA;
m(i) the mean value of the initial and end points of the $i^{th}$ shell;
x(m(i)) the x-coordinate of the mean value;
z(m(i)) the z-coordinate of the mean value, i.e., the mean value of the initial start and end points of the $i^{th}$ shell with respect to the axis of rotation RA;
a, b parameters of the ellipse;
r(i) distance of the $i^{th}$ planar ring section of the $i^{th}$ shell in the plane 7 to be illuminated from the axis of rotation RA; and
NA(i) sine of the angle of aperture of the inner edge ray of the $i^{th}$ ring aperture section of the $i^{th}$ shell.

The mean value of the initial point and the end point of a mirror shell with regard to the axis of rotation, indicates the position of the mirror shell. The position of an outer mirror shell is further distant from plane 7 than is the position of an inner mirror shell.

Figure 8:
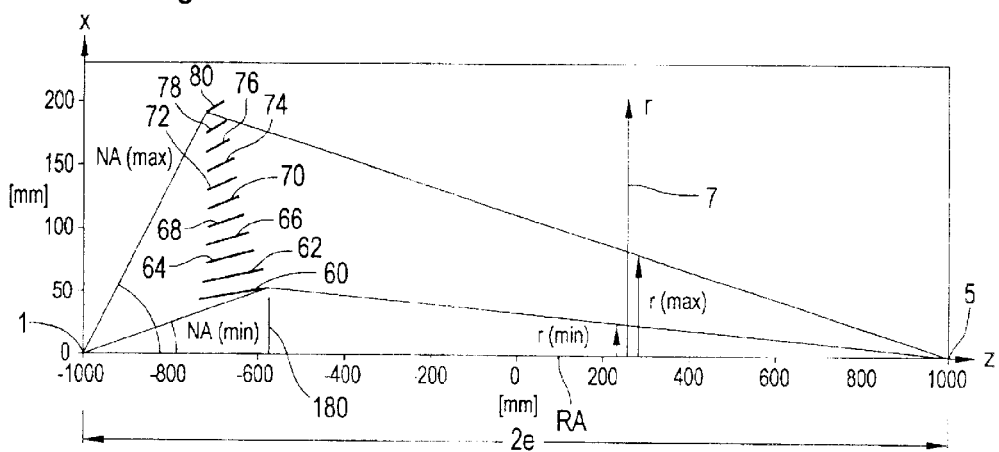
FIG. 8 shows the family of ellipses of a nested collector according to the embodiment in Table 1.

FIG. 8 shows the resulting family or set of ellipses of the shells 60, 62, 64, 66, 68, 70, 72, 74, 76, 80, for the embodiment calculated with the above-defined parameters. The data are indicated in Table 2. All lengths in Table 2 are given in mm. All angles of incidence relative to the surface tangents are at 19°. The angle of incidence relative to the surface tangent of the maximum ray in the example of embodiment according to FIG. 8 amounts to 18.54 degrees.

The following were selected as starting values:
Distance between plane 7 and source image 5:
  z=900 mm
One-half the focal point distance:
  e=1000 mm
Height increment on surface 7;
  dr=7.5 mm
central obscuration in surface 7:
  $r_{min}$~22.5 mm ($NA'_{min}$~0.025)
Minimum aperture $NA_{min}$ for source 1:
  $NA_{min}$=0.12
Maximum collected aperture, $NA_{max}$:
  $NA_{max}$<0.55 corresponding to 33°

Angular increment at source 1:

d$\alpha_i$=2.4°=const. (i.e., isotropic irradiation characteristic of the source).

TABLE 2

Parameters of the family of ellipses

| i | r(i) | NA(i) | a | B | x(h(i)) | z(h(i)) | x(v(i)) | z(v(i)) |
|---|------|-------|---|---|---------|---------|---------|---------|
| 60 | 22,507 | 0,120 | 1002,009 | 63,422 | 52,266 | −567,601 | 43,117 | −734,837 |
| 62 | 30,007 | 0,161 | 1003,391 | 82,423 | 66,429 | −593,993 | 57,195 | −722,489 |
| 64 | 37,507 | 0,203 | 1005,130 | 101,423 | 80,551 | −610,765 | 71,258 | −715,251 |
| 66 | 45,007 | 0,243 | 1007,231 | 120,475 | 94,679 | −622,848 | 85,334 | −710,997 |
| 68 | 52,507 | 0,284 | 1009,699 | 139,612 | 108,838 | −632,382 | 99,443 | −708,705 |
| 70 | 60,007 | 0,324 | 1012,540 | 158,863 | 123,046 | −640,449 | 113,597 | −707,824 |
| 72 | 67,507 | 0,363 | 1015,762 | 178,250 | 137,317 | −647,655 | 127,810 | −708,034 |
| 74 | 75,007 | 0,402 | 1019,374 | 197,798 | 151,664 | −654,371 | 142,092 | −709,139 |
| 76 | 82,507 | 0,440 | 1023,386 | 217,529 | 166,097 | −660,836 | 156,455 | −711,012 |
| 78 | 90,007 | 0,477 | 1027,808 | 237,466 | 180,628 | −667,215 | 170,909 | −713,571 |
| 80 | 97,507 | 0,513 | 1032,654 | 257,632 | 195,269 | −673,626 | 185,464 | −716,763 |

The innermost ring aperture section of collector 3 has a central aperture obscuration and the numerical aperture $NA_{min}$ of the aperture obscuration amounts to a maximum of 0.30, preferably a maximum of 0.20, particularly preferred, a maximum of 0.15, and most particularly preferred, a maximum of 0.1. The object-side aperture has a numerical aperture $NA_{max}$ of at least 0.4, preferably at least 0.5 and, particularly preferred, at least 0.7.

Figure 9:
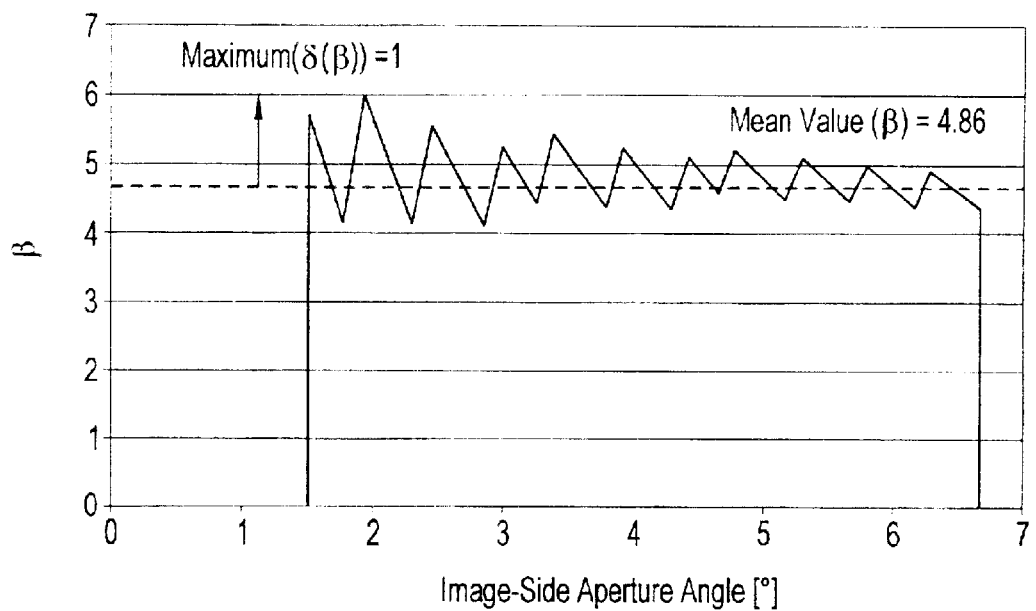
FIG. 9 shows the reduction ratio $\beta$ of the embodiment according to Table 1 as a function of the image-side aperture angle.

The reduction ratio β of the embodiment according to FIG. 8 and Table 2 is plotted in FIG. 9 as the measure for the homogeneity of the illumination as a function of the image-side aperture angle. The reduction ratio β must not be constant over the angle, but a specific reduction ratio must be adjusted via the maximum radius $r_{max}$ in plane 7.

Figure 10:
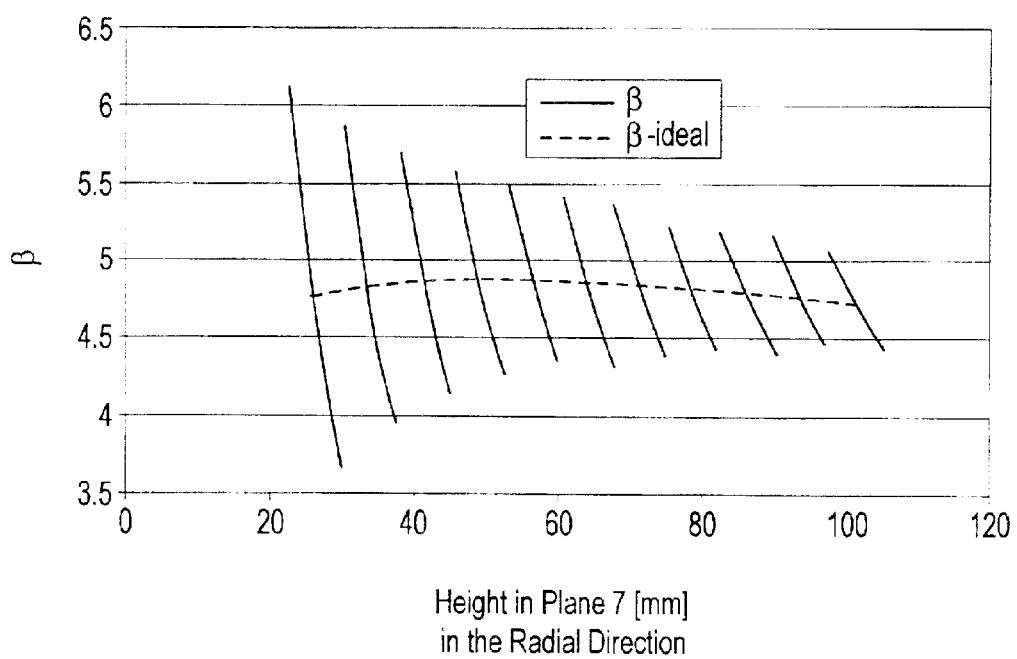
FIG. 10 shows the reduction ratio $\beta$ of the embodiment according to Table 1 as a function of the radius r in plane 7 in the x-direction.

The ideal reduction ratio β-ideal and the real reduction ratio β by discrete solution of the collimation task are shown in FIG. 10 as a function of the radius r in plane 7. The deviation from the ideal reduction ratio can be reduced by increasing the number of shells, for example, by a splitting of the inner shell, e.g., into two shells each time, as shown in FIG. 5. Therefore, a still better homogenization of the illumination can be achieved in plane 7.

Figure 11:
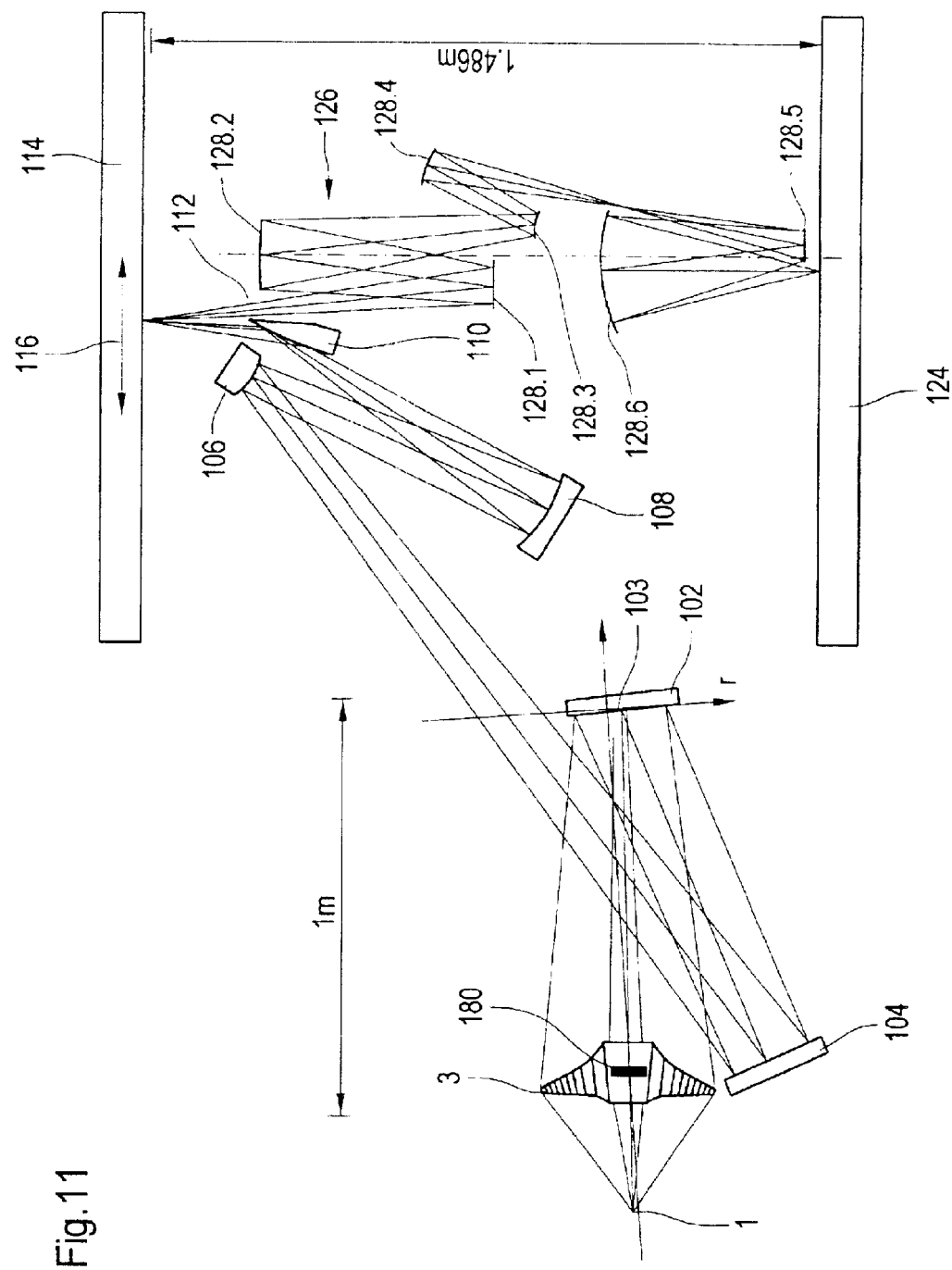
FIG. 11 shows a projection exposure system with a nested collector according to the invention.
Figure 12:
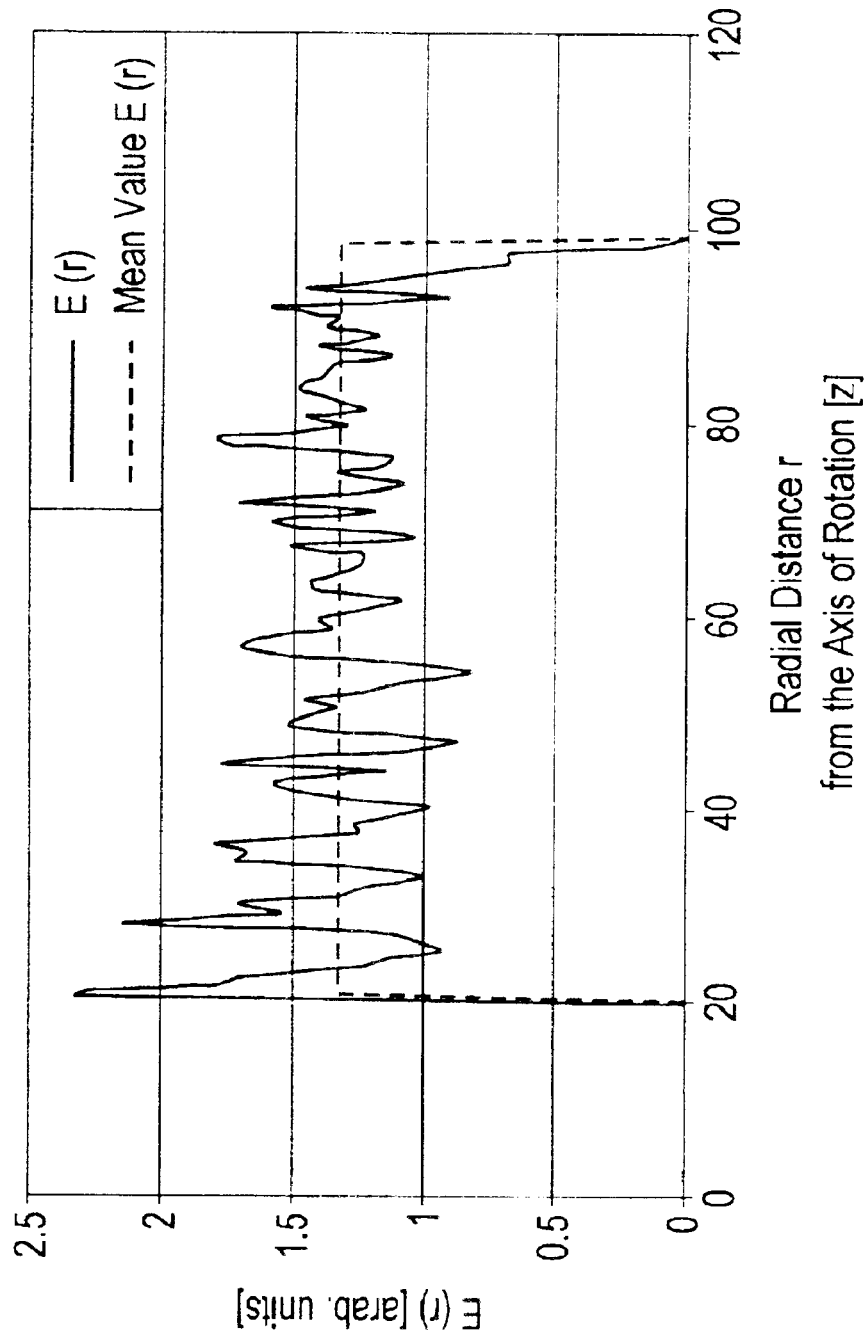
FIG. 12 shows an illumination distribution or irradiance of the planar ring sections in the plane of the first raster elements of the projection exposure system according to FIG. 11 as a function of the radial distance to the axis of rotation z of the system.

FIG. 11 shows a schematic diagram of a projection exposure system, for the production, for example, of microelectronic components, in which the invention can be used. Such a projection exposure system is suitable for use with, but not limited to, light or radiation with EUV wavelengths. The projection exposure system comprises a light source or an intermediate image of a light source 1. The light emitted from light source 1, of which only four representative rays are depicted, is collected by a nested collector 3 according to the invention and is deflected onto a mirror 102 with a plurality of first raster elements, so-called field honeycombs. In the present case, the first raster elements are planar. Mirror 102 is also denoted as a field honeycomb mirror. The illumination in a plane 103 of a plate comprising the plurality of field raster elements is almost homogeneous in a pregiven annular region, as shown in FIG. 12. Plane 103 does not stand precisely perpendicular to the optical axis of the collector and thus does not exactly correspond to plane 7, which is to be homogeneously illuminated, of FIG. 1. Small angles of inclination, however, change nothing relative to the derivation and only lead to slight distortions of the illumination and thus to a negligible deviation from homogeneity, as would be present in a plane perpendicular to the optical axis of the collector.

The illumination system of the projection exposure system includes a double-faceted illumination system as disclosed in U.S. Pat. No. 6,198,793 B1, the content of which is fully incorporated into the present application. The illumination system thus contains a second optical element with raster elements 104, which are also denoted as pupil honeycombs or pupil raster elements. The illumination system also contains optical elements 106, 108 and 110, which essentially serve for the purpose of forming the field in an object plane 114. A reticle in object plane 114 is a reflection mask. The reticle can move in the depicted directions 116 in the projection system designed as a scanning system. An exit pupil of the illumination system is illuminated homogeneously for the most part. The exit pupil coincides with an entrance pupil of a projection objective. The entrance pupil of the projection objective is not shown. The entrance pupil of the projection objective is defined as the point of intersection of the chief ray reflected from the reticle with the optical axis of the projection objective.

A projection objective 126, for example, with six mirrors 128.1, 128.2, 128.3, 128.4, 128.5, 128.6 according to U.S. patent application Ser. No. 09/503,640, images the reticle on a light-sensitive object 124 to be exposed.

FIG. 12 shows the distribution of illumination in the plane of the first optical element with first raster elements and the mean value of the illumination. The irradiance E(r) is shown as a function of the radial distance r from the plane of rotation z of the nested collector. The discrete filling of the homogenized illumination can be clearly seen.

Figure 13:
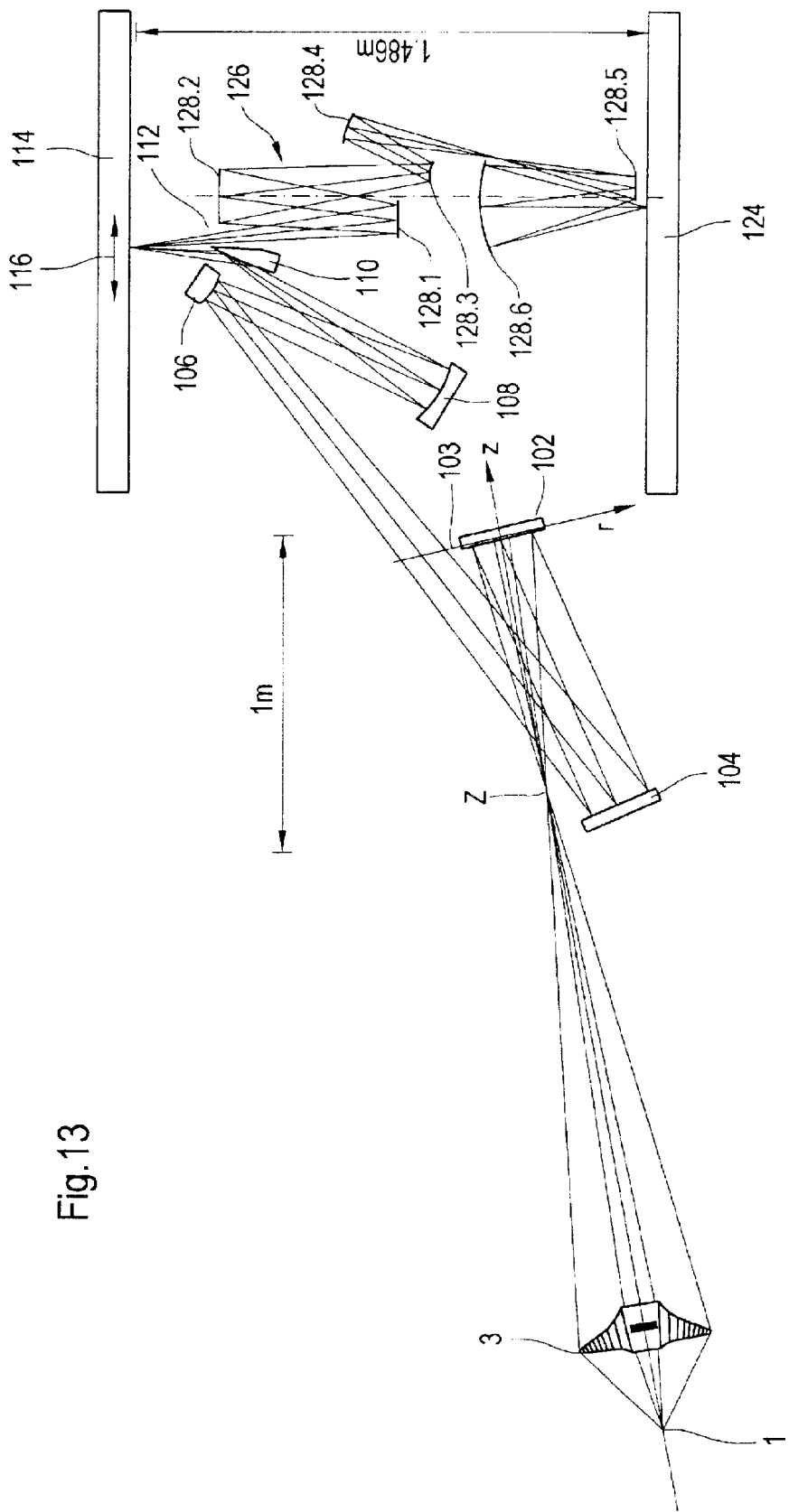
FIG. 13 shows a projection exposure system with an intermediate image with a nested collector.

FIG. 13 shows a schematic diagram of an EUV projection exposure system, which differs from the system shown in FIG. 11 only by the fact that light source 1 is imaged in an intermediate image Z. In addition, the first raster elements now have a collecting or convergent effect. The intermediate image Z of light source 1 is formed between collector 3 and the first faceted mirror 102. All of the other components are identical to the components according to FIG. 11 and thus bear the same reference numbers.

Nested collectors according to the invention, which are designed as Wolter systems, are described in the following FIGS. 14 to 21.

A Wolter system, preferably comprising a combination of a hyperboloid and an ellipsoid for the real imaging of light source 1 in an intermediate image Z of the source, but also the hyperboloid-paraboloid combination for imaging to infinity, is characterized by almost fulfilling the sine condition, i.e., the enlargement or the reduction ratio of a combination of hyperboloid and ellipsoid is constant for the most part over a large aperture range. As FIG. 9 shows, the reduction ratio β within a shell varies very greatly when only simple ellipsoid shells are used for a collector for homogenized illumination. In a Wolter system, the reduction ratio β, in contrast, is almost constant within the shell. This is shown in FIG. 14 for an 8-shell nested system according to FIG. 17, in which each individual shell of the nested mirror shells is a Wolter system, with a first ring-shaped segment with a first optical surface, which is a segment cut out of a hyperboloid and a second ring-shaped segment with a second optical surface, which is a segment cut out of an ellipsoid.

Figure 14:
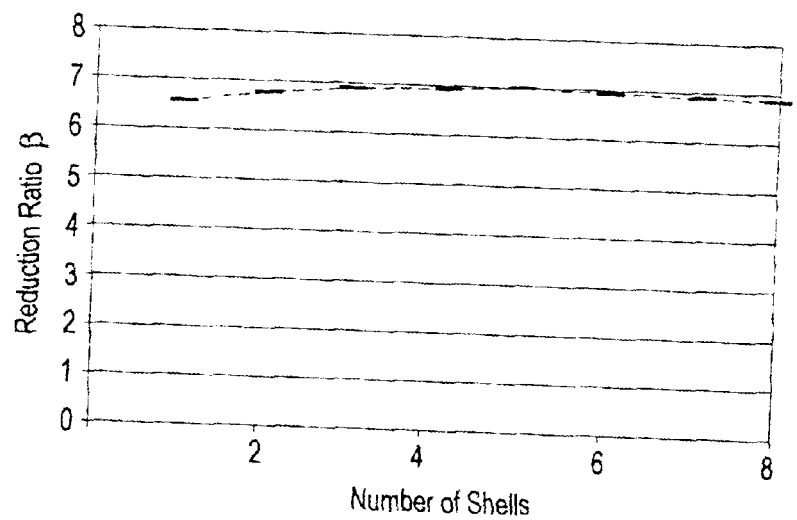
FIG. 14 shows the reduction ratio $\beta$ of an 8-shell nested Wolter system according to FIG. 17.

As shown in FIG. 14, a shell of a Wolter system has a nearly constant reduction ratio β. In order to achieve an ideally homogenized illumination of a plane, it is necessary that gaps, e.g., gaps 26 as shown in FIG. 2, occur in the object-side aperture. This applies particularly also since, while under grazing incidence on the shells that have the greatest distance to the axis of rotation, the reflectivity is smaller than at shells that have the shortest distance to the axis of rotation. Molybdenum, niobium, ruthenium, rhodium, palladium or gold are preferably chosen as mirror materials. The different reflectivities of the different shells are compensated for by an increasing reduction ratio. For homogeneous illumination, the reduction ratio must thus be changed from one shell to another. If a gap-free filling of the aperture after the collector or a gap-free illumination of plane 7 behind the nested collector is desired, then gaps should be present in the object-side aperture. This is not the case in a collector with, for example, ellipsoid-shaped shells, as described in FIGS. 1 to 13, since in that case the reduction ratio varies over the shells and thus, in addition to the homogenized, gap-free illumination of a plane 7, a gap-free object-side aperture can also be achieved.

Figure 15:
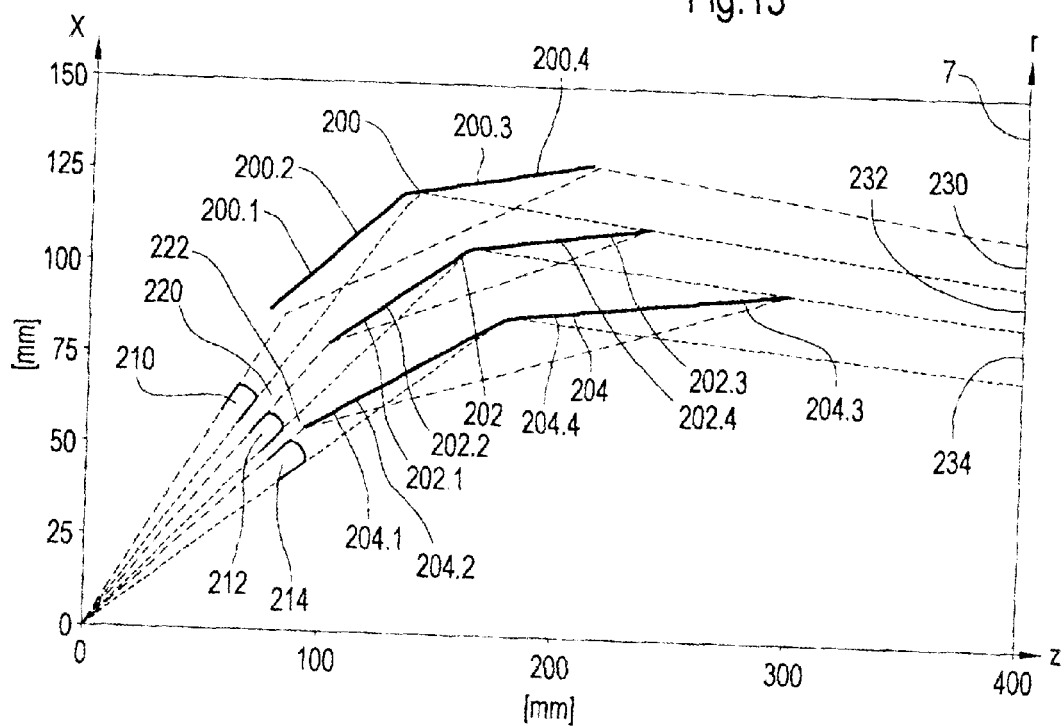
FIG. 15 shows three shells of a nested Wolter system.

Three shells are shown, for example, of a nested collector according to the invention in FIG. 15, wherein each mirror shell 200, 202 and 204 has a Wolter system with a first ring-shaped segment 200.1, 202.1, 204.1 with a first optical surface 200.2, 202.2, 204.2 and a second ring-shaped segment 200.3, 202.3, 204.3 with a second optical surface 200.4, 202.4, 204.4. Note that first optical surfaces 200.2, 202.2, 204.2 and second optical surfaces 200.4, 202.4, 204.4 are all oriented to face the axis of rotation, e.g., the z-axis in FIG. 15. The individual shells 200, 202, 204 are arranged in a rotationally symmetrical manner around the z-axis. The reduction ratio β of the innermost shell 204 amounts to 6.7, that of the second shell 202 to 7.0 and that of the outermost shell 200 to 7.5.

As can be seen from FIG. 15, ring aperture sections 210, 212, 214, which are assigned to the respective mirror shells 200, 202 and 204, do not bound one another. Ring aperture sections 210 and 212 are separated from one another by a gap 220, and ring aperture sections 212 and 214 are separated by a gap 222. Planar ring sections 230, 232, 234, which are in plane 7, are assigned to mirror shells, 200, 202, 204, respectively, and for the most part continuously fit together, that is abut one another without discontinuity, in order to achieve a homogeneous illumination of a region of plane 7.

In the embodiment shown in FIG. 15, the first optical surfaces 200.2, 202.2, 204.2 and the second optical surfaces 200.4, 202.4 and 204.4 are continuously fit together.

Figure 16:
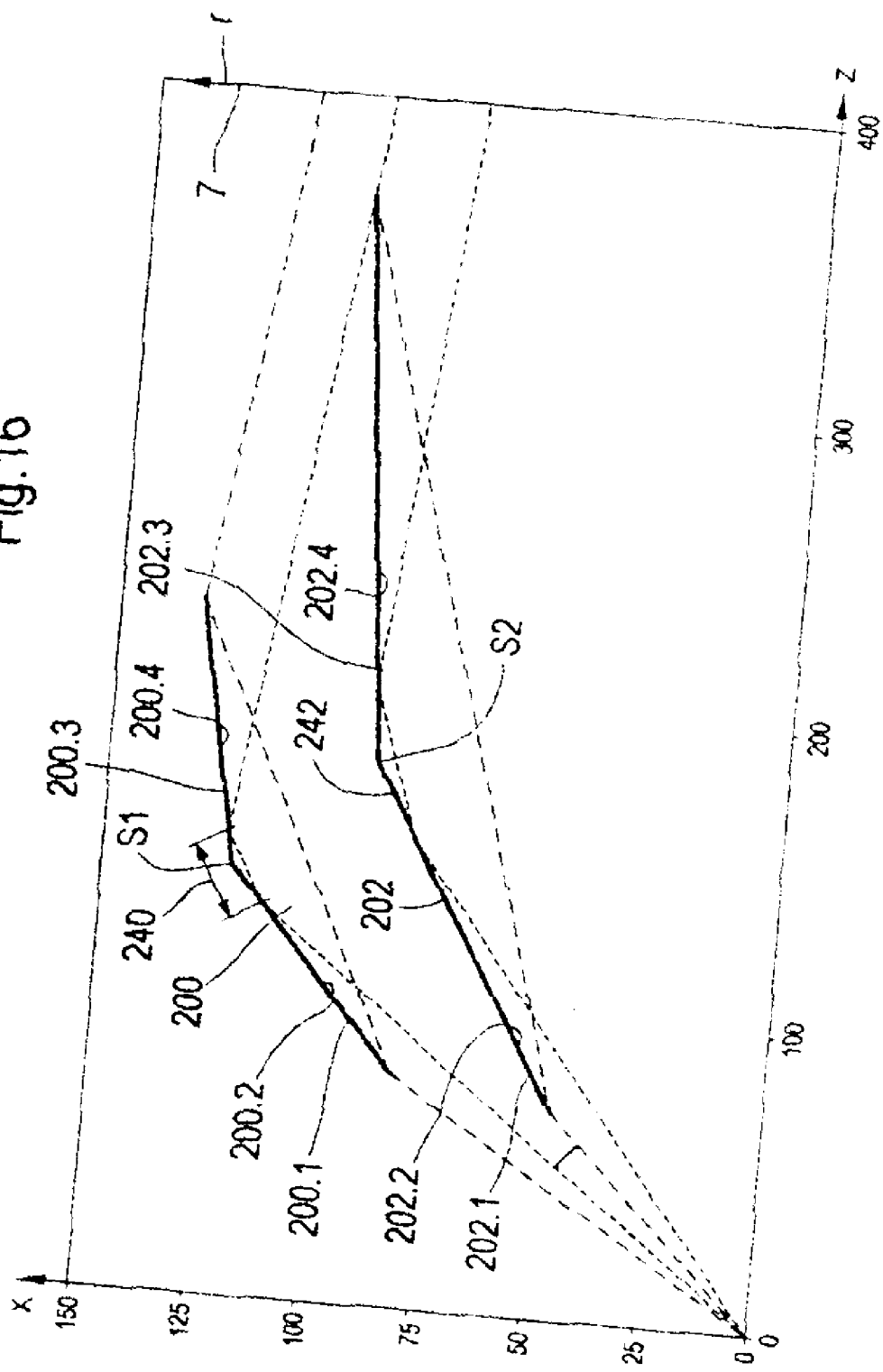
FIG. 16 shows two shells of a nested Wolter system.

FIG. 16 shows another embodiment of the invention, wherein, for example, only two mirror shells 200, 202, which are designed as a Wolter system, are shown. The same components as in FIG. 15 are given the same reference numbers. In the embodiment shown in FIG. 16, the first optical surfaces of the first segment 200.2, 202.2, and the second optical surfaces of the second segment 200.4, 202.4, are not continuously fit together. Each of shells 200 and 202 have a gap or an unused region 240, 242 between the optical surfaces. In the present example, the mirror segments, however, are continued up to the points of intersection S1, S2 of the first and second segments 200.1, 202.1, 200.3, 202.3 of the respective mirror shell, in the unused region.

A design with gaps or unused regions, as shown in FIG. 16, is advantageous in the case of extended light sources.

Figure 17:
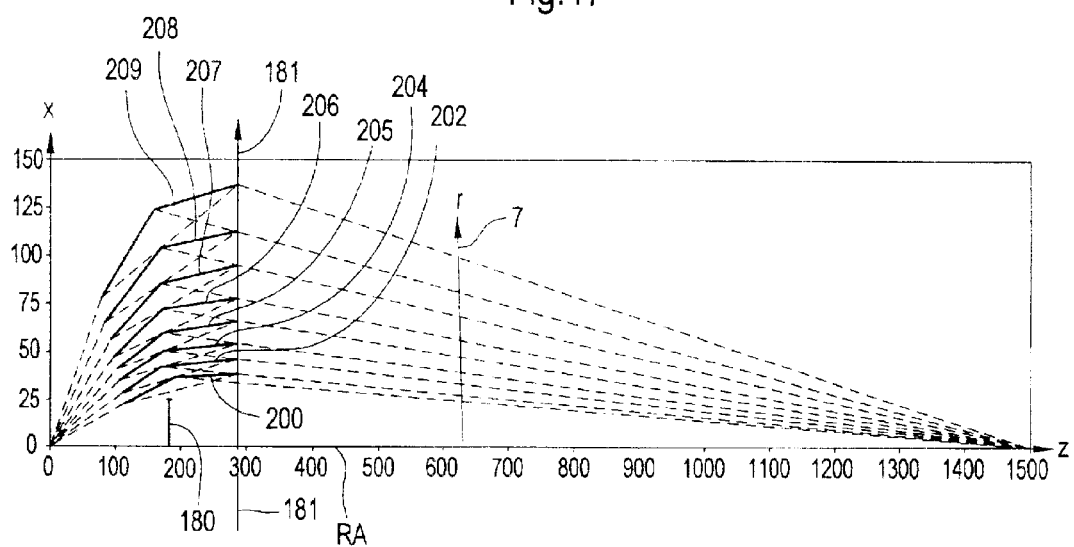
FIG. 17 shows an 8-shell nested Wolter system.

In the design of the collector, a compromise must always be made between collection efficiency and homogeneity of the illumination. If one wishes to achieve only a homogeneity of ±15% in plane 7 to be illuminated, then an 8-shell collector can be utilized for this purpose, as shown in FIG. 17. Here, the respective mirror shells, each with two mirror elements, are denoted 200, 202, 204, 205, 206, 207, 208, and 209, wherein each shell represents a Wolter system.

The collector of FIG. 17 has a distance of 1500 mm between source 1 and intermediate image of the source Z, an object-side aperture of approximately 0.72 and an image-side aperture of approximately 0.115. All angles of incidence relative to the surface tangent are $\leq 13°$. The angle of incidence relative to the surface tangent of the maximum ray amounts to 11.9° in the embodiment according to FIG. 17.

In addition, a diaphragm 180 arranged inside the innermost mirror shell is shown in FIG. 17. Due to the finite size of the mirror shells, the nested, reflective collectors necessarily have a central obscuration, i.e., the radiation of the source cannot be collected below a specific aperture angle $NA_{min}$. Diaphragm 180 prevents the light that comes directly through the central shell as stray light from reaching the illumination system situated in the light path behind the nested collector according to the invention.

Diaphragm 180 is arranged, for example, 78 mm behind the source and has a diameter of 30.3 mm corresponding to an aperture obscuration of $NA_{obs}$ of approximately 0.19. The image-side aperture obscuration correspondingly amounts to $NA'_{obs}$ of approximately 0.0277.

Figure 18:
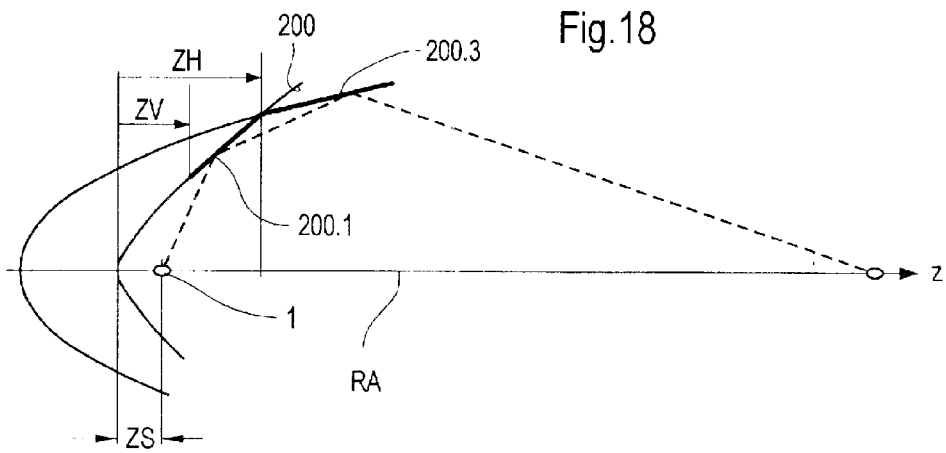
FIG. 18 shows a diagram with the coordinates of a collector shell, designed as a Wolter system with two reflections.

For example, for the mirror shells 200, 202, 204, 205, 206, 207, 208, 209 of the collector according to FIG. 17, the characteristic coordinates of a Wolter system comprising two segments, for example, a first segment 200.1 and a second segment 200.3 of the first mirror shell 200 are shown in FIG. 18. ZS denotes the z-position of the surface vertex ZS referred to the position of light source 1, ZV and ZH denote the initial and final positions of the first segment 200.1, which is a hyperboloid, referred to the position of the surface vertex ZS. The references ZS, ZH and ZV are used in an analogous way for the second segment 200.3 of the mirror shell, which is an ellipsoid.

Using the radii of curvature R and the conical constant K of the respective mirror segment as well as the given definitions, the design data of the collector according to FIG. 17 result from the following Table 3. Ruthenium was selected as a coating material for the mirror shells.

TABLE 3

Design data of the collector according to FIG. 17

| Shell | R [mm] | K | ZS [mm] | ZV [mm] | ZH [mm] |
|---|---|---|---|---|---|
| Hyperboloid | | | | | |
| 1 | 1.5866 | −1.0201 | −0.79 | 108.99 | 185.86 |
| 2 | 2.3481 | −1.0286 | −1.17 | 107.92 | 183.90 |
| 3 | 3.5076 | −1.0399 | −1.74 | 107.56 | 182.35 |
| 4 | 5.0414 | −1.0571 | −2.49 | 105.05 | 179.53 |
| 5 | 7.2534 | −1.0814 | −3.56 | 102.83 | 177.68 |
| 6 | 10.4354 | −1.1182 | −5.07 | 99.95 | 175.90 |
| 7 | 15.0523 | −1.1755 | −7.22 | 94.87 | 173.09 |
| 8 | 22.3247 | −1.2660 | −10.50 | 88.88 | 169.39 |
| Ellipsoid | | | | | |

TABLE 3-continued

Design data of the collector according to FIG. 17

| Shell | R [mm] | K | ZS [mm] | ZV [mm] | ZH [mm] |
|---|---|---|---|---|---|
| 1 | 2.3724 | −0.9971 | −160.94 | 349.66 | 433.46 |
| 2 | 3.3366 | −0.9960 | −168.17 | 353.68 | 440.17 |
| 3 | 4.6059 | −0.9945 | −181.56 | 363.50 | 454.10 |
| 4 | 6.4739 | −0.9923 | −184.74 | 364.03 | 457.33 |
| 5 | 9.0813 | −0.9893 | −189.80 | 366.19 | 463.15 |
| 6 | 12.8589 | −0.9849 | −193.20 | 365.14 | 466.03 |
| 7 | 18.4682 | −0.9783 | −195.28 | 362.33 | 470.02 |
| 8 | 26.8093 | −0.9688 | −202.36 | 362.94 | 480.72 |

The embodiment of the Wolter system according to FIG. 17 with eight shells is selected, such that the ends of all of the shells end up approximately in the same plane 181. Although not shown in FIG. 17, a mounting structure for mounting the individual shells can be situated in plane 181. Preferably, diaphragm 180 is arranged in this plane or in its vicinity.

Figure 19:
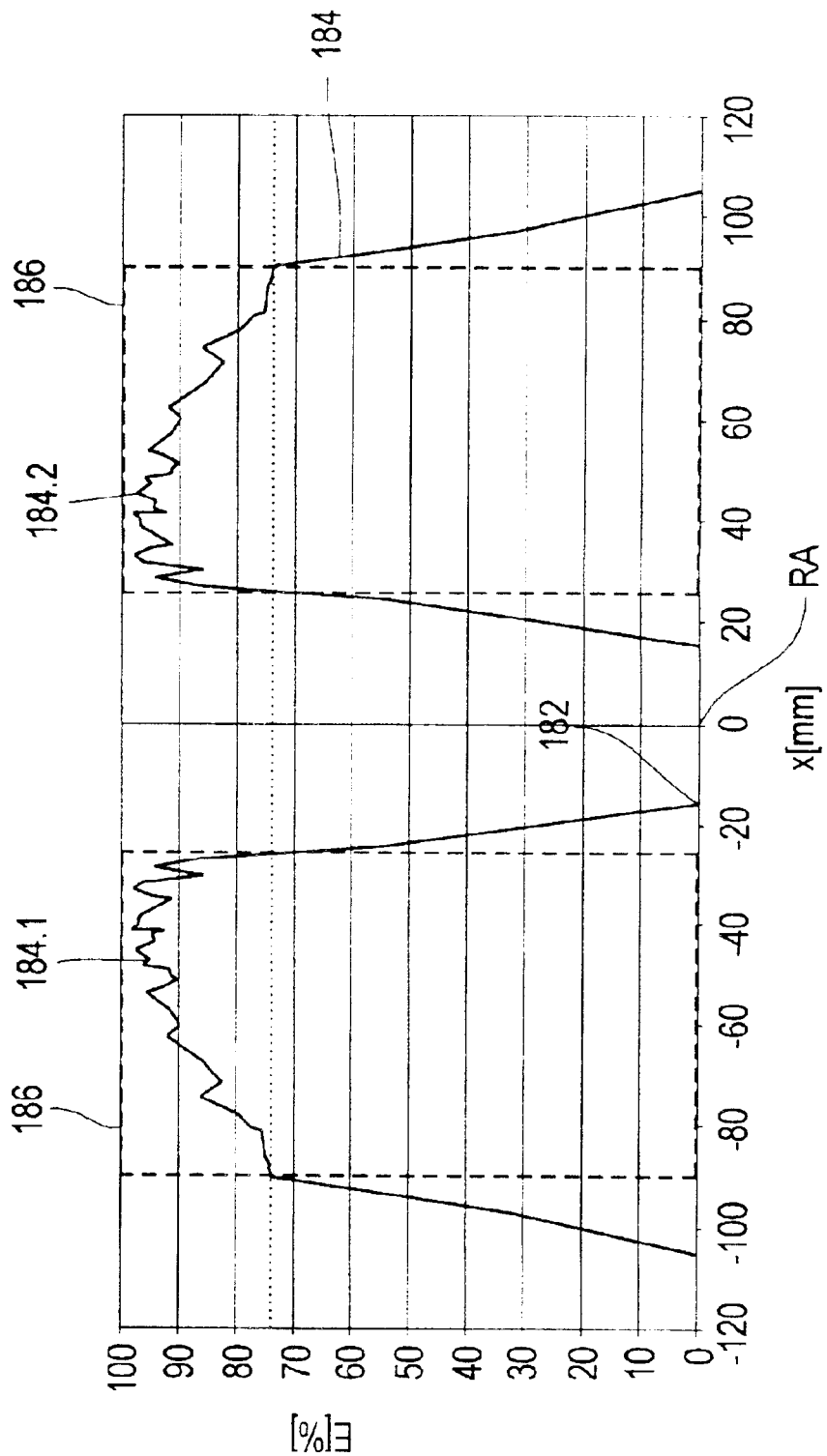
FIG. 19 shows the illumination distribution or irradiance of the planar ring sections in the plane of the first raster elements of a system according to FIG. 20 with a collector according to FIG. 17.
Figure 20:
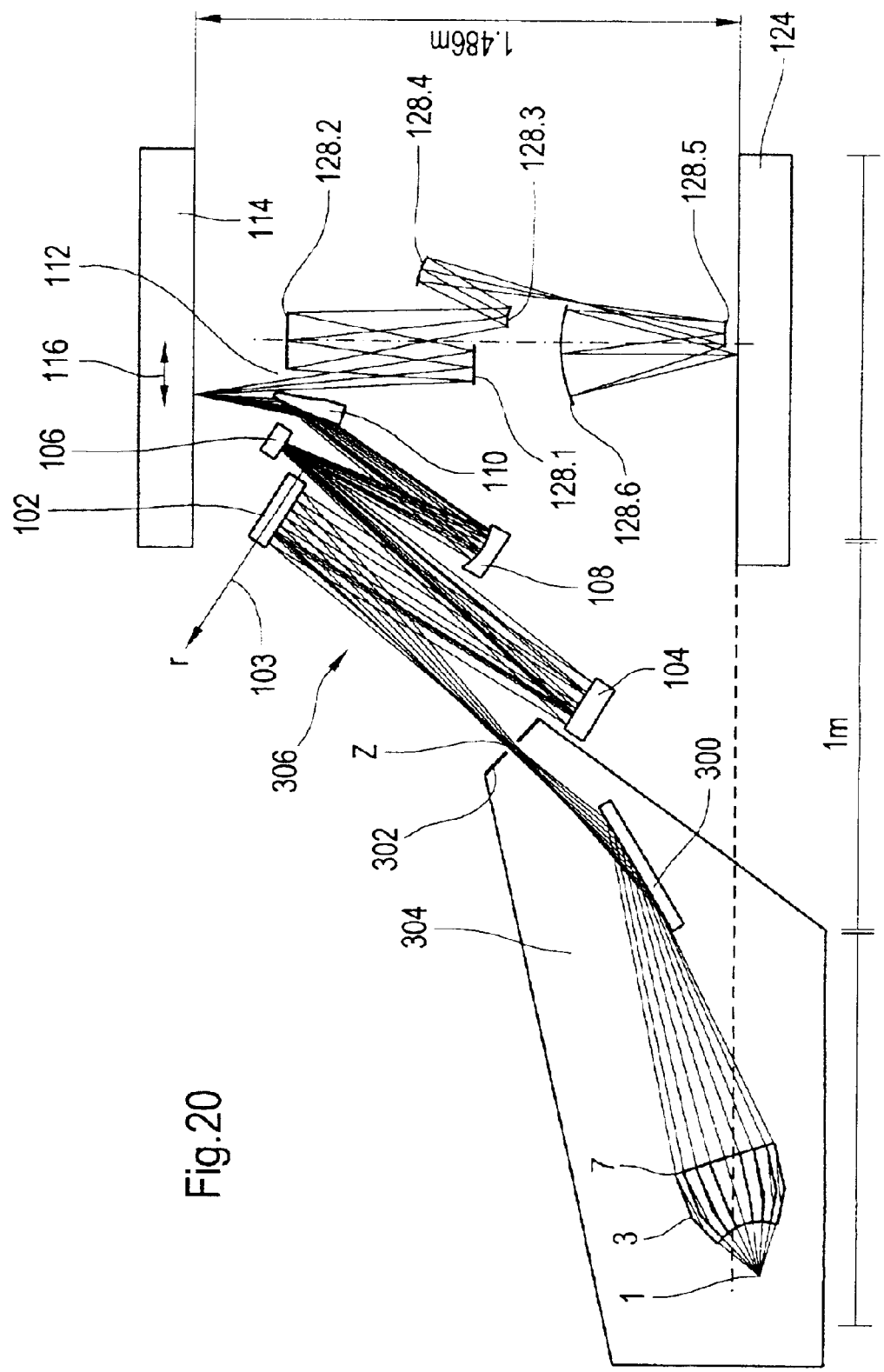
FIG. 20 shows an EUV projection exposure system with a nested collector according to FIG. 17.

FIG. 19 shows the distribution of the illumination in plane 7 of the illumination system according to FIG. 20. The illumination system according to FIG. 20 comprises an 8-shell nested collector according to FIG. 17, which is situated directly behind the light source. The calculation of the irradiance according to FIG. 19 was based on a ruthenium coating of the mirror shells with their reflectivity being dependent from the angle of incidence. The design of the collector can be adapted accordingly for other coatings.

The central obscuration by diaphragm 180 can be clearly recognized in FIG. 19. The central obscuration is given the reference number 182. The intensity distribution in plane 7 is denoted as 184. Two intensity peaks 184.1 and 184.2, which are symmetrical relative to the axis of rotation RA of the collector and which lead to an annular illumination in plane 7, can be clearly seen. The dashed curve 186 gives the region in which first raster elements are arranged on the first optical element 102 of the illumination system according to FIG. 20.

The optical components and the beam path of several light rays of a projection exposure system with a nested collector according to FIG. 17 are shown in FIG. 20. The same components as in the projection exposure system according to FIG. 11 are given the same reference numbers.

In contrast to the projection exposure system according to FIG. 11, the illumination system is not folded like an "X", but is optimized to be compact. In order to reduce the system length, the image-side aperture of the nested collector 3, which has a structure as in FIG. 17, is also increased to NA=0.115, for which the design as a Wolter system is particularly advantageous. The object-side aperture amounts to NA~0.71. In addition, a planar mirror 300 is inserted following collector 3 in order to fold the system. This makes available free space for mechanical and electronic components in the object plane 114, in which a wafer stage is arranged. The entire optical system is less than 3 m long and less than 1.75 m high.

The planar mirror 300 in this embodiment has been designed as a diffractive spectral filter. The diffractive spatial filter comprises a grating element. Together with a diaphragm 302 in the vicinity of an intermediate image Z of the source, undesired radiation, for example with wavelengths essentially greater than the desired wavelength of 13.5 nm in the present case, can be kept from entering into the illumination system lying behind diaphragm 302.

Diaphragm 302 can also serve for the purpose of spatially separating a space 304 comprising light source 1, nested collector 3, as well as the planar mirror 300 designed as a diffractive spectral filter from the other part of an illumination system 306. If both spaces are separated, e.g., by a valve in the vicinity of the intermediate focus Z, then a pressure-type separation is also possible. Due to the spatial or pressure-type separation, contaminations that result from the light source can be prevented from entering into the illumination system behind diaphragm 302.

Figure 21:
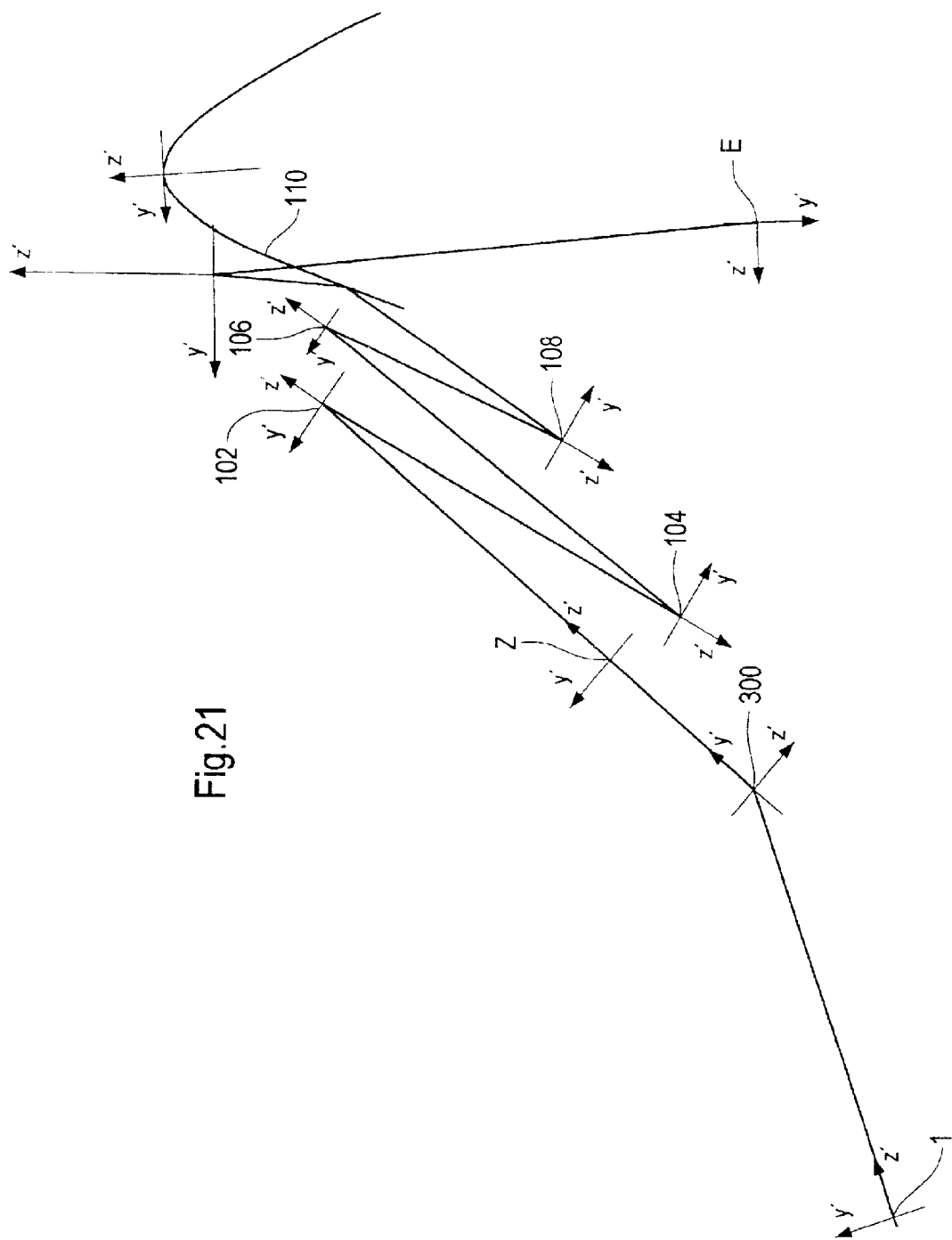
FIG. 21 shows coordinate systems of all mirrors of the EUV projection exposure system according to FIG. 20 with the nested collector according to FIG. 17.

The illumination system shown in FIG. 20 comprises a nested collector 3 with 8 shells according to FIG. 17 and Table 3. The planar mirror 300 of the design according to FIG. 20 is configured as a spectral filter with a diffraction angle of 2° between the zero order and the utilized diffraction order. The first optical element, i.e., mirror 102 comprises 122 first raster elements, each with dimensions of 54 mm×2.75 mm. The second optical element 104 has 122 second raster elements assigned to the first raster elements, each of which has a diameter of 10 mm. All of the positional data of the optical components in Table 4 are referred to the reference coordinate system in object plane 114. The relation by angle a around the local x-axis of the local coordinate systems assigned to the respective optical components results after a translation displacement of the reference coordination system at the site of the local coordinate system. The parameters of the optical components of the illumination system according to FIG. 20 are given in Table 4. The positions of the vertex points of the individual optical elements referred to object plane 114 are given in Table 4 as well as the angle of rotation a of the coordinate systems around the x-axis. In addition, the coordinate systems are right-handed and based on rotation in clockwise direction. In addition to the local coordinate systems of the optical components, the local coordinate systems of intermediate focus Z and entrance pupil E are indicated. The field-forming mirror, i.e., optical element 110 comprises an eccentric segment of a rotation hyperboloid. The coordinate systems for all optical elements of the illumination system according to FIG. 20, which are described in Table 4, except for nested collector 3, are shown in FIG. 21. All of the optical elements are given the same reference numbers as in FIG. 20.

The system is designed for a field radius of 130 mm with a illumination aperture of NA=0.03125 in object plane 114, i.e., at the reticle, corresponding to a filling degree of σ=0.5 in the entrance pupil E of a 4:1 projection objective with an aperture NA=0.25 in the plane of the object 124 to be exposed.

TABLE 4

Design data of the system according to FIG. 20

| Position | Y | Z | α | Vertex radius of curvature | Conical constant |
|---|---|---|---|---|---|
| light source | 2148.137 | −1562.205 | 70.862 | - no mirror surface - | |
| planar mirror or spectral filter 200 | 1184.513 | −1227.797 | 147.434 | Planar | |
| intermediate focus Z | 883.404 | −893.382 | 42.000 | - no mirror surface - | |
| first facetted optical element 102 | 302.599 | −248.333 | 36.000 | −898.54 | Spherical |
| second facetted optical element 104 | 773.599 | −1064.129 | 214.250 | −1090.15 | Spherical |
| mirror 106 | 126.184 | −250.216 | 31.500 | 288.1 | Spherical |

TABLE 4-continued

Design data of the system according to FIG. 20

| Position | Y | Z | α | Vertex radius of curvature | Conical constant |
|---|---|---|---|---|---|
| mirror 108 | 372.926 | −791.643 | 209.600 | −855.8 | Spherical |
| mirror vertex of mirror 110 | −227.147 | 118.541 | −4.965 | −80.5 | −1.1485701 |
| object plane 114 | 0.000 | 0.000 | 0.000 | Planar | |
| entrance pupil E | −130.000 | −1236.867 | 0.000 | - no mirror surface - | |

As in the case of the nested collector shown in FIGS. 1 to 13, the shells of the Wolter system can also be simply produced by replication techniques.

Figure 22:
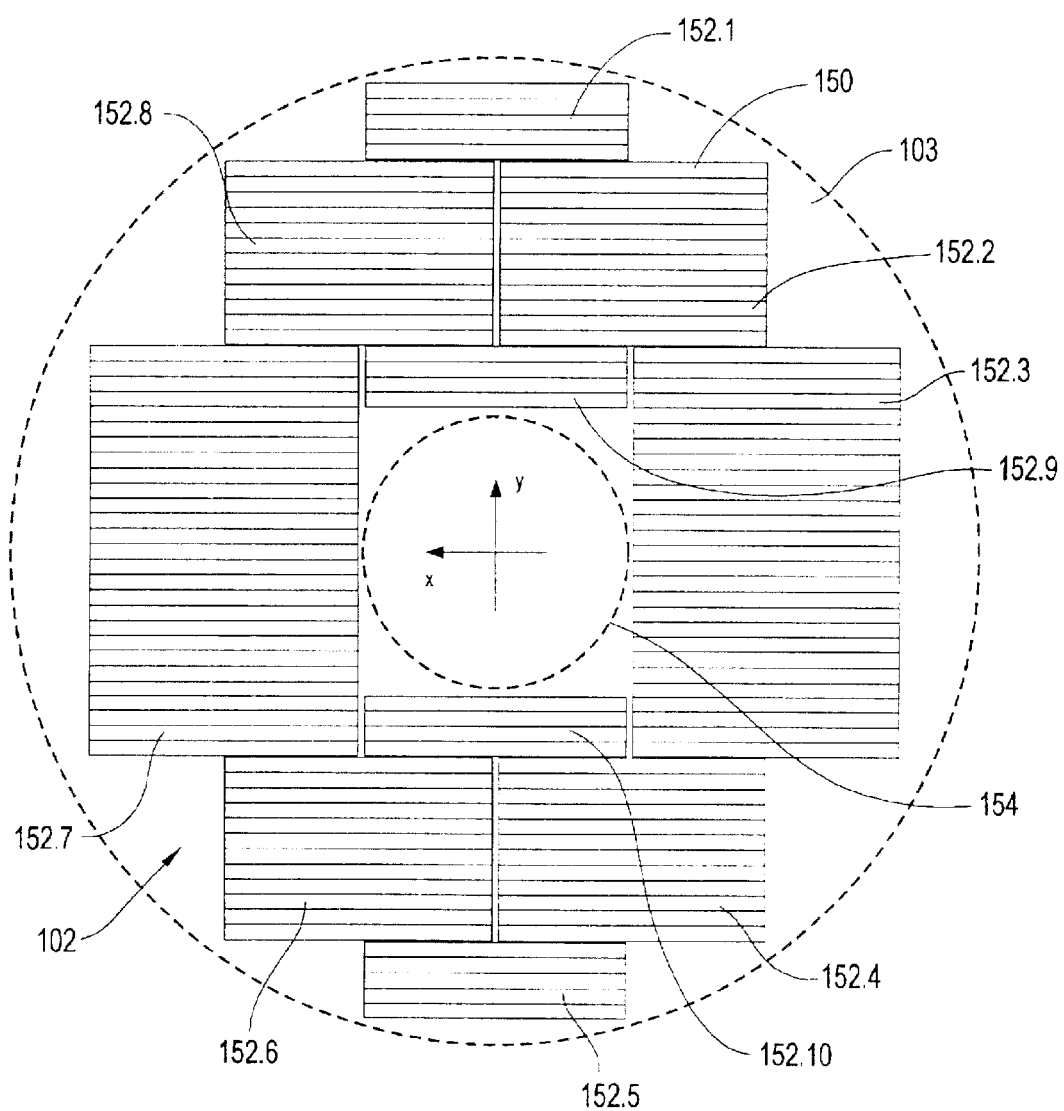
FIG. 22 shows a first optical element of an illumination system according to FIG. 20 with first raster elements.

FIG. 22 shows the first optical element, i.e., mirror 102, situated in a plane 7 homogeneously illuminated by the nested collector 3 of the illumination system according to FIG. 20 with the local x-y coordinate system. The arrangement of 122 first raster elements 150 can be clearly seen.

The first raster elements 150 are arranged in ten blocks 152.1, 152.2, 152.3, 152.4, 152.5, 152.6, 152.7, 152.8, 152.9, and 152.10, which are distanced from one another. First raster elements 150 are not arranged in the region of plane 7 that is not illuminated due to the central shadowing 154 of collector 3. The maximum deviation of the irradiance between individual first grid elements 150 is smaller than ±15% with the use of a nested collector according to FIG. 17.

Figure 23:
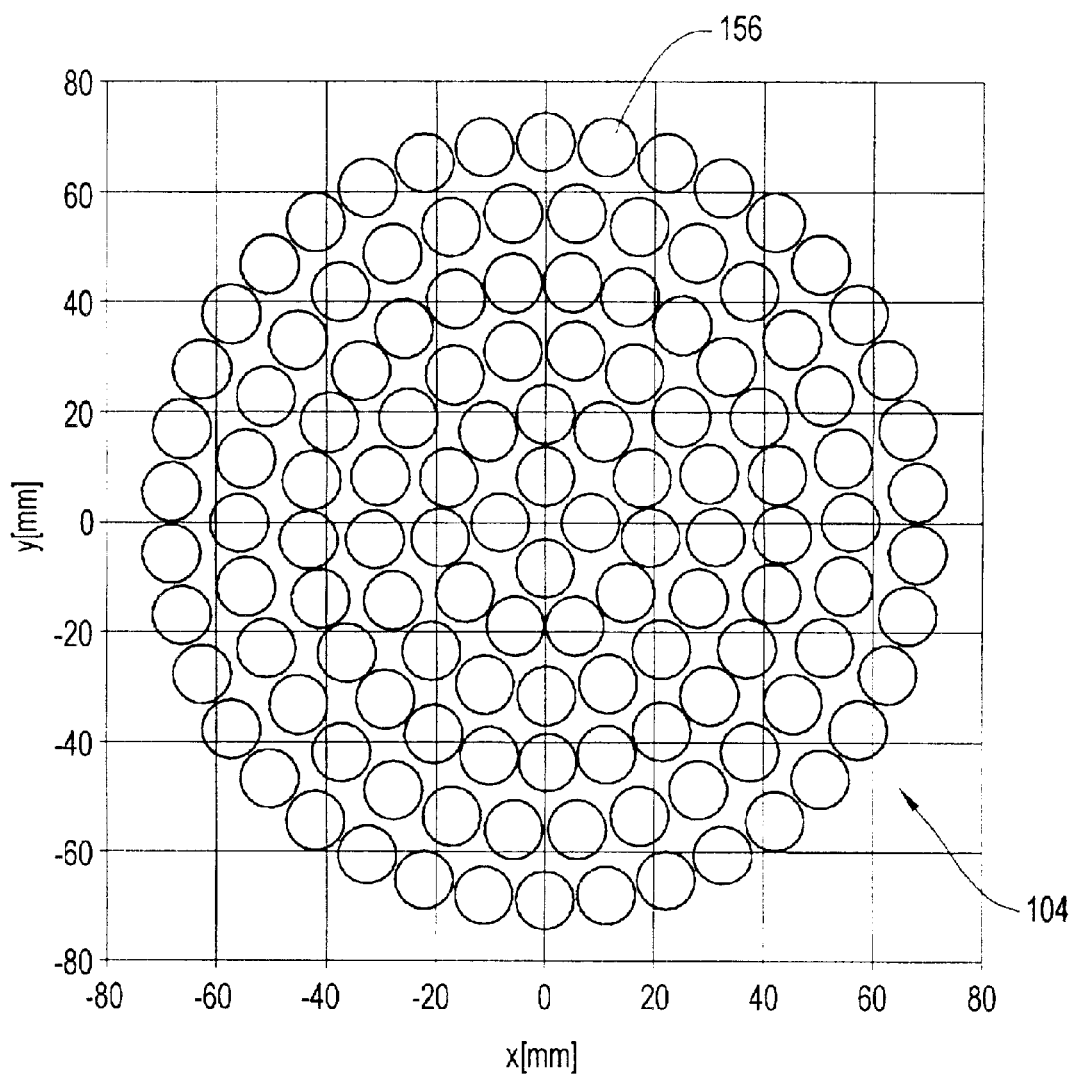
FIG. 23 shows a second optical element of an illumination system according to FIG. 20 with second raster elements.

FIG. 23 shows the arrangement of the second raster elements 156 on the second optical element 104. The images of the second raster elements 156 fill the exit pupil of the illumination system continuously up to a given filling degree of σ=0.5. With respect to the definition of filling degree in the exit pupil, reference is made to WO 01/09684, the disclosure content of which is fully incorporated in the present application.

The invention indicates for the first time a collector, which images an arbitrary light source into an image of the source. The source image can be real, virtual or lie in infinity. The irradiation characteristic of the arbitrary light source will be retransformed so that an almost homogeneous illumination results in a plane in front of or behind the intermediate image.

It should be understood that various alternatives and modifications of the present invention could be devised by those skilled in the art. The present invention is intended to embrace all such alternatives, modifications and variances that fall within the scope of the appended claims.

What is claimed is:

1. A collector for guiding light with a wavelength of ≦193 nm onto a plane, said collector comprising:

a first mirror shell for receiving a first ring aperture section of said light and irradiating a first planar ring section of said plane with a first irradiance;

a second mirror shell for receiving a second ring aperture section of said light and irradiating a second planar ring section of said plane with a second irradiance; and a central aperture obscuration with a numerical aperture≦0.30, wherein said light impinges with an angle of incidence of less than 20° to surface tangents of said first and second mirror shells, wherein said first and second mirror shells are rotationally symmetrical and concentrically arranged around a common axis of rotation, wherein said first and second ring aperture sections do not overlap with one another, wherein said first planar ring section substantially abuts said second planar ring section, wherein said first irradiance is approximately equal to said second irradiance, and wherein said collector has a focal point.

2. A collector for guiding light with a wavelength of ≦193 nm onto a plane, said collector comprising:

a first mirror shell for receiving a first ring aperture section of said light and irradiating a first planar ring section of said plane with a first irradiance; and a second mirror shell for receiving a second ring aperture section of said light and irradiating a second planar ring section of said plane with a second irradiance, wherein said first and second mirror shells are rotationally symmetrical and concentrically arranged around a common axis of rotation, wherein said first and second ring aperture sections do not overlap with one another, wherein said first planar ring section substantially abuts said second planar ring section, wherein said first irradiance is approximately equal to said second irradiance, and wherein said first mirror shell includes a first segment with a first optical surface and a second segment with a second optical surface.

3. The collector of claim 2, wherein said first segment is from a hyperboloid and said second segment is from an ellipsoid.

4. The collector of claim 2, wherein said first segment is from a hyperboloid and said second segment is from a paraboloid.

5. The collector of claim 2, wherein said first and second mirror shells have dimensions that are different from one another in a direction of said axis of rotation.

6. The collector of claim 2, wherein said first mirror shell is an inner mirror shell and said second mirror shell is an outer mirror shell, wherein said first mirror shell has a mean value of an initial point and an end point with regard to said axis of rotation that indicates a position of said first mirror shell, wherein said second mirror shell has a mean value of an initial point and an end point with regard to said axis of rotation that indicates a position of said second mirror shell, and wherein said position of said outer mirror shell is further distant from said plane than said position of said inner mirror shell.

7. The collector of claim 2, wherein said first and second ring aperture segments are separated by a gap.

8. The collector of claim 2, further comprising a central aperture obscuration with a numerical aperture≦0.30.

9. The collector of claim 8, wherein said central aperture obscuration comprises a diaphragm concentric to, and interior to, said first mirror shell.

10. The collector of claim 2, wherein said collector has an object-side maximum numerical aperture $NA_{max} \geq 0.4$.

11. The collector of claim 2, wherein said first and second mirror shells are two of a plurality of at least three mirror shells.

12. The collector of claim 2, wherein said light is from a light source that emits rays that impinge with an angle of incidence of less than 20° to surface tangents of said first and second mirror shells.

13. An illumination system, comprising the collector of claim 2.

14. The illumination system of claim 13, further comprising an optical element having raster elements.

15. The illumination system of claim 14, wherein said raster elements are located within said first and second planar ring section.

16. The illumination system of claim 14, wherein said optical element is a first optical element, and wherein said illumination system further comprises a second optical element for imaging.

17. The illumination system of claim 14, wherein said optical element is a first optical element, and wherein said illumination system further comprises a second optical element for field shaping.

18. The illumination system of claim 13, wherein said plane is a first plane, and wherein said illumination system has a second plane conjugated to a light source for said light, between said collector and said first plane, in which an intermediate image of said light source is formed.

19. The illumination system of claim 18, further comprising a diaphragm in or near said intermediate image, wherein said diaphragm separates a space containing said light source and said collector from a portion of said illumination system downstream of said diaphragm.

20. An EUV projection exposure system comprising:
the illumination system of claim 13 for illuminating a mask; and
a projection objective for imaging said mask on a light-sensitive object.

21. A collector for guiding light with a wavelength of $\leq 193$ nm onto a plane, said collector comprising:
a first mirror shell for receiving a first ring aperture section of said light and irradiating a first planar ring section of said plane with a first irradiance;
a second mirror shell for receiving a second ring aperture section of said light and irradiating a second planar ring section of said plane with a second irradiance; and
a central aperture obscuration with a numerical aperture $\leq 0.30$,
wherein said first and second mirror shells are rotationally symmetrical and concentrically arranged around a common axis of rotation,
wherein said first and second ring aperture sections do not overlap with one another,
wherein said first planar ring section substantially abuts said second planar ring section, and
wherein said first irradiance is approximately equal to said second irradiance.

22. The collector of claim 21, wherein said central aperture obscuration comprises a diaphragm concentric to, and interior to, said first mirror shell.

23. An illumination system for illuminating an object plane with radiation $\leq 193$ nm from a light source, comprising:
a collector, wherein said collector has a mirror shell and an optical system arranged in a light path from the light source to the object plane behind said collector,
a plane conjugated to said light source in said light path, situated between said collector and said optical system, in which an intermediate image of said light source is formed; and
a diaphragm in or near said intermediate image, wherein said diaphragm separates a space containing said light source and said collector from a portion of said illumination system downstream of said diaphragm.

24. A collector for guiding light with a wavelength $\leq 193$ nm comprising:
a first mirror shell; and
a second mirror shell,
wherein said first and second mirror shells are rotationally symmetrical and concentrically arranged around a common axis of rotation, and
wherein said collector has a central aperture obscuration with a numerical aperture $\leq 0.30$.

25. The collector of claim 24, wherein said first and second mirror shells have dimensions that are different from one another in a direction of said axis of rotation.

26. The collector of claim 24,
wherein said collector guides said light onto a plane,
wherein said first mirror shell is an inner mirror shell and said second mirror shell is an outer mirror shell,
wherein said first mirror shell has a mean value of an initial point and an end point with regard to said axis of rotation that indicates a position of said first mirror shell,
wherein said second mirror shell has a mean value of an initial point and an end point with regard to said axis of rotation that indicates a position of said second mirror shell, and
wherein said position of said outer mirror shell is further distant from said plane than said position of said inner mirror shell.

27. The collector of claim 24,
wherein said collector guides said light onto a plane,
wherein said first mirror shell is for receiving a first ring aperture section of said light and irradiating a first planar ring section of said plane with a first irradiance,
wherein said second mirror shell is for receiving a second ring aperture section of said light and irradiating a second planar ring section of said plane with a second irradiance,
wherein said collector has:
a first quotient of (i) a first ratio of a radial dimension of said first planar ring section to an angular extension of said first ring aperture section and (ii) a second ratio of a radial dimension of said second planar ring section to an angular extent of said second ring aperture section; and
a second quotient of (i) a first radiant intensity, which is reduced by a loss of reflectivity of said first mirror shell, which flows into said first ring aperture section, and of (ii) a second radiant intensity, which is reduced by a loss of reflectivity of said second mirror shell, which flows into said second ring aperture section,
wherein said first quotient is substantially equal to said second quotient.

28. The collector of claim 24,
wherein said collector guides said light onto a plane,
wherein said first mirror shell is for receiving a first ring aperture section of said light and irradiating a first planar ring section of said plane with a first irradiance,
wherein said second mirror shell is for receiving a second ring aperture section of said light and irradiating a second planar ring section of said plane with a second irradiance, wherein said collector has:
- a first ratio of a radial dimension of said first planar ring section to an angular extent of said first ring aperture section; and
- a second ratio of a radial dimension of said second planar ring section to an angular extent of said second ring aperture section, and wherein said first ratio is substantially equal to said second ratio.

29. The collector of claim 24, wherein said collector guides said light onto a plane, wherein said first mirror shell is for receiving a first ring aperture section of said light and irradiating a first planar ring section of said plane with a first irradiance, wherein said second mirror shell is for receiving a second ring aperture section of said light and irradiating a second planar ring section of said plane with a second irradiance, wherein said first and second planar ring sections have radial dimensions of equal size, wherein said first and second planar ring sections are concentric, wherein said first planar ring section is an inner planar ring section and said second planar ring section is an outer planar ring section, wherein said first mirror shell has a dimension in a direction of said axis of rotation, wherein said second mirror shell has a second dimension in said direction of said axis of rotation, and wherein said dimension of said first mirror shell is larger than said dimension of said second mirror shell.

30. The collector of claim 24, wherein said first and second mirror shells are each a ring-shaped segment of an aspherical object.

31. The collector of claim 24, wherein said first and second mirror shells are each a ring-shaped segment of a form selected from the group consisting of an ellipsoid, a paraboloid and a hyperboloid.

32. The collector of claim 24, wherein said first mirror shell comprises a first segment with a first optical surface and a second segment with a second optical surface.

33. The collector of claim 32, wherein said first segment is from a hyperboloid and said second segment is from an ellipsoid.

34. The collector of claim 32, wherein said first segment is from a hyperboloid and said second segment is from a paraboloid.

35. The collector of claim 24, wherein said collector guides said light onto a plane, wherein said first mirror shell is for receiving a first ring aperture section of said light and irradiating a first planar ring section of said plane with a first irradiance, wherein said second mirror shell is for receiving a second ring aperture section of said light and irradiating a second planar ring section of said plane with a second irradiance, wherein said first and second ring aperture segments are separated by a gap.

36. The collector of claim 24, wherein said central aperture obscuration comprises a diaphragm concentric to, and interior to, said first mirror shell.

37. The collector of claim 24, wherein said collector has an object-side maximum numerical aperture $NA_{max} \geq 0.4$.

38. The collector of claim 24, wherein said first and second mirror shells are two of a plurality of at least three mirror shells.

39. An illumination system, comprising the collector of claim 24.

40. The illumination system of claim 39, further comprising an optical element having raster elements.

41. The illumination system of claim 40, wherein said collector guides said light onto a plane, wherein said first mirror shell is for receiving a first ring aperture section of said light and irradiating a first planar ring section of said plane with a first irradiance, wherein said second mirror shell is for receiving a second ring aperture section of said light and irradiating a second planar ring section of said plane with a second irradiance, wherein said raster elements are located within said first and second planar ring sections.

42. The illumination system of claim 40, wherein said optical element is a first optical element, and wherein said illumination system further comprises a second optical element for imaging.

43. The illumination system of claim 40, wherein said optical element is a first optical element, and wherein said illumination system further comprises a second optical element for field shaping.

44. The illumination system of claim 39, wherein said collector guides said light onto a first plane, and wherein said illumination system has a second plane conjugated to a light source for said light, between said collector and said first plane, in which an intermediate image of said light source is formed.

45. The illumination system of claim 44, further comprising a diaphragm in or near said intermediate image, wherein said diaphragm separates a space containing said light source and said collector from a portion of said illumination system downstream of said diaphragm.

46. An EUV projection exposure system comprising:

the illumination system of claim 39 for illuminating a mask; and a projection objective for imaging said mask on a light-sensitive object.

47. A process for producing a microelectronic device, comprising using the EUV projection exposure system of claim 46.

* * * * *